United States Patent
Adachi

(10) Patent No.: US 8,067,145 B2
(45) Date of Patent: *Nov. 29, 2011

(54) DEVELOPING SOLUTION AND METHOD FOR PRODUCING LITHOGRAPHY PRINTING PLATE

(75) Inventor: Keiichi Adachi, Haibara-gun (JP)

(73) Assignee: Fujifilm Corporation, Minato-Ku, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 11/698,143

(22) Filed: Jan. 26, 2007

(65) Prior Publication Data

US 2007/0178414 A1 Aug. 2, 2007

(30) Foreign Application Priority Data

Feb. 1, 2006 (JP) .................. 2006-024718
May 1, 2006 (JP) .................. 2006-127788

(51) Int. Cl.
G03F 7/00 (2006.01)
G03F 7/26 (2006.01)

(52) U.S. Cl. ........ 430/302; 430/138; 430/309; 430/434; 101/463.1

(58) Field of Classification Search ............... 430/270.1, 430/302
See application file for complete search history.

(56) References Cited

U.S. PATENT DOCUMENTS 5,035,982 A 7/1991 Walls
(Continued)

FOREIGN PATENT DOCUMENTS

JP 62-056966 A 3/1987
(Continued)

OTHER PUBLICATIONS

Extended European Search Report, European Patent Application No. 07002073.3-1226, dated Mar. 10, 2008.
(Continued)

Primary Examiner — Cynthia Kelly
Assistant Examiner — Chanceity Robinson
(74) Attorney, Agent, or Firm — Buchanan, Ingersoll & Rooney PC

(57) ABSTRACT

A developing solution includes at least one of a compound represented by formula (I) and a compound represented by formula (II) and being at pH 2 to 10:

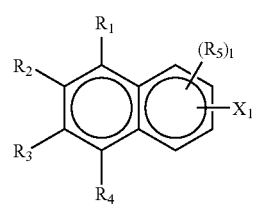

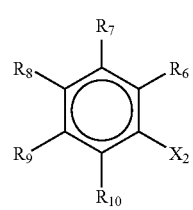

wherein, in the formula (I) and (II), $R_1$ to $R_{10}$ each independently represent one of a hydrogen atom an alkyl group; "l" represents an integer of 1 to 3; and $X_1$ and $X_2$ each independently represent one of a sulfonate salt, a sulfate monoester salt, a carboxylate salt and a phosphate salt, provided that the total sum of the carbon atoms in $R_1$ to $R_5$ and the total sum of the carbon atoms in $R_6$ to $R_{10}$, respectively is 3 or more.

6 Claims, 1 Drawing Sheet

U.S. PATENT DOCUMENTS

| | | | |
|---|---|---|---|
| 5,155,012 A | 10/1992 | Joerg et al. | |
| 5,316,892 A * | 5/1994 | Walls et al. | 430/309 |
| 6,686,126 B2 * | 2/2004 | Tsuchiya et al. | 430/302 |
| 6,881,532 B2 * | 4/2005 | Suzuki | 430/302 |
| 2002/0033109 A1 | 3/2002 | Aoshima | |
| 2003/0215750 A1 * | 11/2003 | Inno | 430/302 |
| 2004/0013968 A1 * | 1/2004 | Teng | 430/270.1 |
| 2004/0244619 A1 * | 12/2004 | Goto | 101/453 |
| 2005/0153242 A1 | 7/2005 | Takagi | 430/300 |
| 2005/0181301 A1 * | 8/2005 | Matsumura | 430/270.1 |
| 2005/0221226 A1 * | 10/2005 | Yamasaki | 430/270.1 |
| 2005/0263021 A1 * | 12/2005 | Mitsumoto et al. | 101/463.1 |
| 2005/0271976 A1 * | 12/2005 | Kakino et al. | 430/270.1 |
| 2006/0046199 A1 * | 3/2006 | Mitsumoto et al. | 430/302 |
| 2007/0020563 A1 * | 1/2007 | Inno | 430/302 |
| 2008/0093219 A1 * | 4/2008 | Goldberg et al. | 204/556 |

FOREIGN PATENT DOCUMENTS

| | | |
|---|---|---|
| JP | 4-507007 | 12/1992 |
| JP | 11-65126 A | 3/1999 |
| JP | 2938397 B2 | 6/1999 |
| JP | 2001-175004 A | 6/2001 |
| JP | 2002-91016 A | 3/2002 |
| JP | 2002-365814 A | 12/2002 |
| JP | 2003-107718 A | 4/2003 |
| JP | 2005-202274 A | 7/2005 |
| JP | 2006-001022 A | 1/2006 |
| WO | WO 2005/111717 A2 | 11/2005 |
| WO | WO 2005111727 A1 * | 11/2005 |

OTHER PUBLICATIONS

Office Action issued in corresponding Japanese Patent Application No. 2006-127788 dated Nov. 2, 2010 with English Translation.

Office Action from Japanese Patent Office issued in corresponding Japanese Patent Application No. 2006-127788 date Mar. 8, 2011, with an English translation.

European Search Report, Jun. 12, 2007.

* cited by examiner

DEVELOPING SOLUTION AND METHOD FOR PRODUCING LITHOGRAPHY PRINTING PLATE

BACKGROUND OF THE INVENTION

1. Field of the Invention

The present invention relates to a developing solution and a method for producing a lithography printing plate. More specifically, the invention relates to a developing solution for lithography printing plate, which enables a developing treatment in a region at acidity to low alkalinity and with which development can be done even in an acidic region and which involves developing smut dispersed at good stability after development, as well as a method for producing a lithography printing plate.

2. Background Art

Generally, lithography printing plate comprises a lipophilic image part and a hydrophilic non-image part receiving ink and moistening water, respectively in a printing course. Lithography is a printing process comprising generating difference in ink deposition on the surface of a lithography printing plate by utilizing the repulsive properties of water and printing ink to each other while a lipophilic image part on the lithography printing plate is used as an ink acceptor and a hydrophilic non-image part is used as a moistening water acceptor (a part never accepting ink) to deposit ink on the image part alone and transferring the ink onto a printing matter such as paper.

So as to prepare such lithography printing plate in the related art, a lithography printing plate precursor (PS plate) with a lipophilic photosensitive resin layer (photosensitive layer, image recording layer) arranged on a hydrophilic support has been used widely. Generally, lithography printing plate is obtained by a plate-production process comprising exposing such lithography printing plate precursor through an original picture such as lith type film, subsequently leaving a part working as an image part on an image recording layer as it is, while dissolving and removing the unnecessary image recording layer except the aforementioned image part with an alkaline developing solution or an organic solvent, and then exposing the hydrophilic support surface to form a non-image part.

At the plate-production process of producing a lithography printing plate precursor in the related art, as described above, a step of dissolving and removing the unnecessary image recording layer with a developing solution and the like post-exposure is essential. Treatment with developing solutions closer to neutrality which generates less liquid waste is an issue from the standpoint of environmental and safety concerns. In view of global environment, in particular, ingredients in liquid waste discharged from wet processes draw serious concerns in the entire industries. Therefore, increasing demands are now directed toward the overcoming of the issues.

Meanwhile, recently, digital techniques for electronically processing, accumulating and outputting image information with computer have been spread widely. Various types of new image output modes corresponding to such digital techniques have been applied in practical sense. Following the trend, the computer-to-plate (CTP) technique for directly producing a lithography printing plate with no use of lith type film has drawn attention, which comprises immobilizing digitalized image information with highly collimating radiation such as laser beam and using the beam for scanning and exposing the lithography printing plate precursor. Therefore, it is one of the important technical issues to obtain a lithography printing plate precursor suitable for such technique.

As described above, the preparation of developing solutions to lower alkalinity and the simplification of the processing steps have increasingly been desired more than ever in terms of both the concerns for global environment and the conformity with space saving and low running cost. As described above, nevertheless, the developing process generally comprises the following three steps: a step of development with an alkaline solution at pH 10 or more, a step of flushing off the alkali solution in a water rinsing bath, and a step of subsequent treatment with a gum solution mainly comprising a hydrophilic resin. Therefore, an automatic developing apparatus itself occupies a significantly large space. Additionally, environmental problems and running cost problems including disposals of for example liquid waste from development, liquid waste from the water rinsing step and liquid gum waste still remain unresolved.

In contrast, for example, JP-A-2002-91016 (the term "JP-A" as used herein means an "unexamined published Japanese patent application") proposes a development process in an alkaline solution containing a nonionic surfactant, pH 10 to 12.5, where the development process comprises allowing a photosensitive composition to contain an alkali-soluble polymer. Therefore, the process disadvantageously involves a problem such that development cannot be attained at the above defined pH or lower. For example, additionally, Japanese Patent No. 2938397) describes a lithography printing plate precursor prepared by arranging an image forming layer with a hydrophobic thermoplastic polymer particle dispersed in a hydrophilic binder, on a hydrophilic support. Via image exposure using infrared laser, the hydrophobic thermoplastic polymer particle is thermally coupled together to form an image; then, the lithography printing plate precursor is mounted on the cylinder of a printer, and can be developed with moistening water and/or ink on the printer.

As described above, such process of forming an image via the coupling of the particles via simple thermal melting generates a great developing performance on the machine but the resulting image strength (adhesion to support) is so extremely poor, disadvantageously, that the printing resistance thereof is insufficient.

As described above, the development systems with alkaline agents disadvantageously have caused environmental concerns, the supplementation of solutions compensating the pH decrease due to carbonate gas absorption, the arrangement of an apparatus therefor, the increase of liquid waste from the systems and the running cost issue of the developing solutions.

Additionally, it is very hard to secure a developing performance via development in a region at acidity to low alkalinity and it is also difficult to disperse the components of a photosensitive layer in a non-image part stably in such developing solution. Accordingly, the components of the photosensitive layer precipitate in a developing tank. In the course of the running process, the resulting precipitates deposit as developing smut on the printing plate during the processing, disadvantageously causing image defects readily.

SUMMARY OF THE INVENTION

It is an object of the invention to overcome the disadvantages of the techniques in the related art and provide a developing solution for lithography printing plate, which allows development in a region at acidity to neutrality and which can overcome the problem generated then via development in the region and the problem of the stable dispersion of the components of the photosensitive layer (developing smut) desmutted during development, as well as a process of producing a lithography printing plate.

The present inventor made investigations so as to attain the object. The inventor found that the treatment of a lithography printing plate precursor without any alkali-soluble acidic groups, using an aqueous solution containing a specific anionic surfactant after image exposure, could achieve a developing performance in a region at acidity to low alkalinity and also found a developing solution with excellent dispersibility of developing smut. Thus, the invention has been achieved. The invention is now described below.

(1) According to a first aspect of the present invention, a developing solution comprising at least one of a compound represented by formula (I) and a compound represented by formula (II) and being at pH 2 to 10:

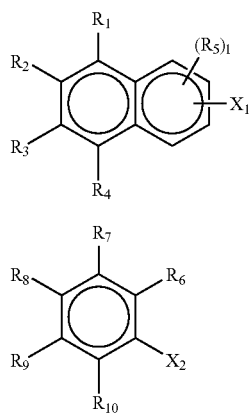

wherein, in the formula (I) and (II), $R_1$ to $R_{10}$ each independently represent one of a hydrogen atom and an alkyl group; "l" represents an integer of 1 to 3; and $X_1$ and $X_2$ each independently represent one of a sulfonate salt, a sulfate monoester salt, a carboxylate salt and a phosphate salt, provided that the total sum of the carbon atoms in $R_1$ to $R_5$ and the total sum of the carbon atoms in $R_6$ to $R_{10}$, respectively is 3 or more.

(2) The developing solution as described in the item (1), wherein the total sum of the carbon atoms in $R_1$ to $R_5$ in the compound represented by the formula (I) and the total sum of the carbon atoms in $R_6$ to $R_{10}$ in the compound represented by the formula (II), respectively is 24 or less.

(3) The developing solution as described in the item (1), wherein at least one of $R_1$ to $R_5$ in the compound represented by the formula (I) and at least one of $R_6$ to $R_{10}$ in the compound represented by the formula (II), respectively is represented by formula A:

Formula A wherein, in the formula, $n \geq 2$; $n \geq m \geq 0$.

(4) The developing solution as described in the item (1), wherein the concentration of the total sum of the compound represented by the formula (I) and the compound represented by the formula (II) is 1% by mass or more.

(5) The developing solution as described in the item (1), which comprises a water-soluble polymer compound.

(6) According to a second aspect of the present invention, a method for producing a lithography printing plate comprising: curing an image recording layer of a lithography printing plate precursor at an exposed part via image-like exposure, the image recording layer being provided on a support; and developing by an aqueous solution having pH 2 to 10 and containing at least one of a compound represented by formula (I) and a compound represented by formula (II):

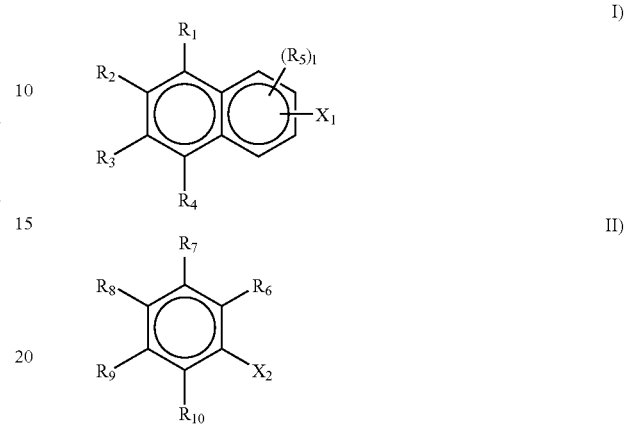

wherein, in the formula, $R_1$ to $R_{10}$ each independently represent one of a hydrogen atom and an alkyl group; "l" represents an integer of 1 to 3; and $X_1$ and $X_2$ each independently represent one of a sulfonate salt, a sulfate monoester salt, a carboxylate salt and a phosphate salt, provided that the total sum of the carbon atoms in $R_1$ to $R_5$ and the total sum of the carbon atoms in $R_6$ to $R_{10}$, respectively is 3 or more.

(7) The method for producing a lithography printing plate as described in the item (6), wherein the image recording layer comprises a polymerization initiator, a polymerizable compound and a hydrophobic binder.

(8) The method for producing a lithography printing plate as described in the item (6), which comprises a protective layer on the image recording layer.

(9) The method for producing a lithography printing plate as described in the item (6), wherein the image-like exposure is performed by using a laser irradiating a beam of 760 to 1,200 nm.

(10) The method for producing a lithography printing plate as described in the item (6), wherein the image-like exposure is performed by using a laser irradiating a beam of 250 to 420 nm

(11) The method for producing a lithography printing plate as described in the item (7), wherein at least one of the polymerization initiator, polymerizable compound and hydrophobic binder are enclosed in a microcapsule.

(12) The method for producing a lithography printing plate as described in the item (6), wherein the exposed lithography printing plate precursor is subjected to heat treatment during a period of exposure to development.

In accordance with the invention, a lithography printing plate of constant quality can be produced with a developing solution containing at least any one of compounds represented by the formulas (I) and (II) as a specific anionic surfactant, where the developing solution enables development in the form of an aqueous solution, pH 2 to 10 without any deterioration with carbonate gas and the developing solution constantly exerts a predetermined developing performance. Additionally, the developing solution is advantageous in terms of the supplemented volume of the developing solution, the decrease of liquid waste, the running cost, and the environmental concerns. Still additionally, the problem of the stable dispersion of the photosensitive layer (developing smut) desmutted via development can be overcome. In accordance with the invention, a developing solution for lithography printing plate with no smut deposition but with great stain resistance can be provided. In accordance with the invention, further, a process of producing a lithography printing plate can be provided as well.

BRIEF DESCRIPTION OF THE DRAWINGS

The invention disclosed herein will be understood better with reference to the following drawings of which.

DETAILED DESCRIPTION OF THE INVENTION

Figure 1:
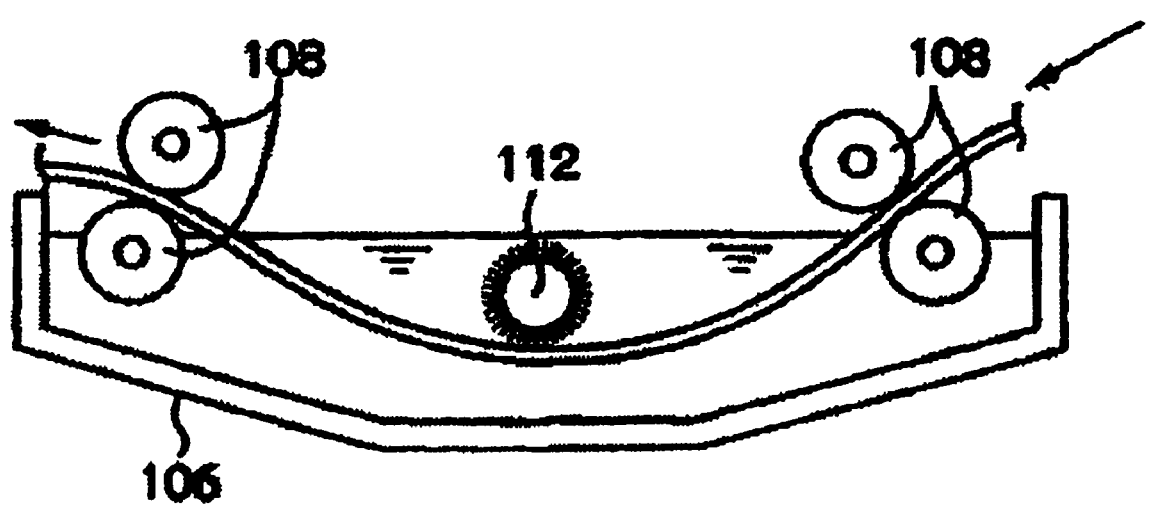
FIG. 1 is a schematic view of the developing machine.

The developing solution for lithography printing plate and a process of producing a lithography printing plate in accordance with the invention are now described below.
(Developing Solution)

The developing solution for lithography printing plate in accordance with the invention (sometimes simply referred to as "developing solution" hereinafter) contains at least any one of compounds represented by the following formula (I) and compounds represented by the following formula (II) as an anion-type surfactant.

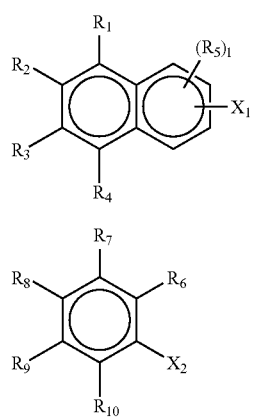

(In the formula, $R_1$ through $R_{10}$ independently represent H or an alkyl group; "l" represents an integer of 1 to 3; and $X_1$ and $X_2$ independently represent a sulfonate salt, a sulfate monoester salt, a carboxylate salt or a phosphate salt, provided that the total sum of the carbon atoms in $R_1$ through $R_5$ or in $R_6$ and $R_{10}$ is 3 or more).

When the total sum of the carbon atoms of $R_1$ through $R_5$ in the formula is 3 or more in the compound corresponding to the formula (I), the effect can be observed. When the total sum of the carbon atoms of $R_1$ through $R_5$ is larger, the hydrophobic part occupies such a large area that the compound is hardly dissolved in aqueous developing solutions. Even when auxiliary dissolution agents helping dissolution, such as organic solvents, are mixed into water, in this case, the surfactant cannot be dissolved within a suitable mix range. Generally, the total sum of the carbon atoms of $R_1$ and $R_5$ are 24 or less. More preferably, the total sum of the carbon atoms of $R_1$ through $R_5$ is 3 to 20. In case that $R_1$ through $R_5$ are alkyl groups, herein, the structures thereof may be linear or branched.

The total sum of the carbon atoms of $R_1$ and $R_5$ in the compound (surfactant) is under influence of materials for use in the photosensitive layer, particularly a binder. In case of a highly hydrophilic binder, the total sum of the carbon atoms of $R_1$ through $R_5$ may satisfactorily be relatively small. When a binder at low hydrophilicity is used, the total sum of the carbon atoms of $R_1$ through $R_5$ should be larger.

Further, $X_1$ in the compound is specifically a sulfonate salt, a sulfate monoester salt, a carboxylate salt or a phosphate salt. Among them, the effects of a sulfonate salt and a carboxylate salt are particularly high. Among these salts, alkali metal salts are particularly preferable because the alkali metal salts dissolve well in aqueous solvents. Among them, sodium salts and potassium salts are particularly preferable. More specifically, the compound is exemplified below.

There are shown below examples of the compound where $R_1$ through $R_5$ are alkyl groups without any oxygen atom.

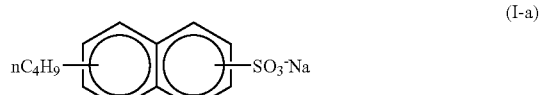
(I-a)

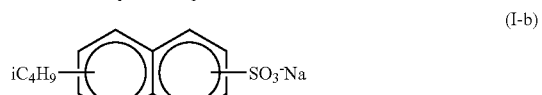
(I-b)

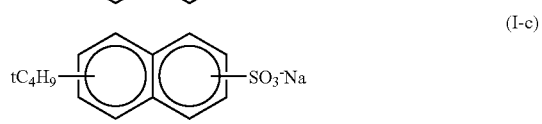
(I-c)

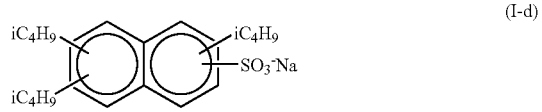
(I-d)

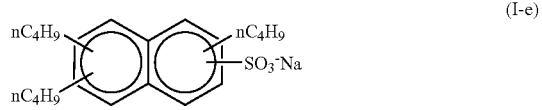
(I-e)

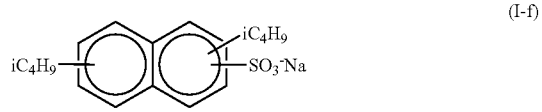
(I-f)

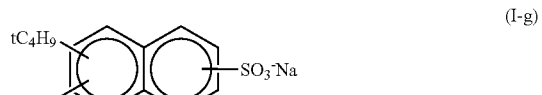
(I-g)

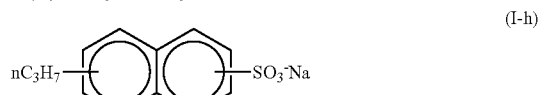
(I-h)

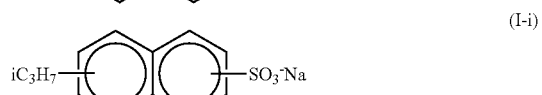
(I-i)

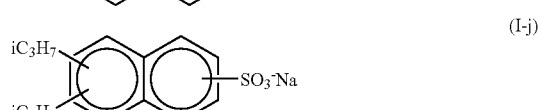
(I-j)

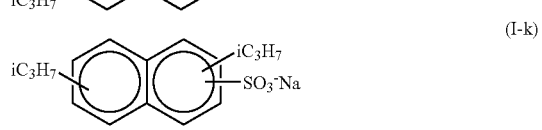
(I-k)

 (I-l)

 (I-m)

 (I-n)

 (I-o)

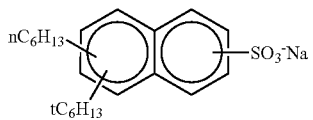 (I-p)

 (I-q)

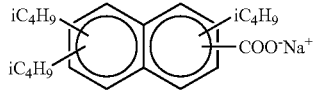 (I-r)

Examples of $R_1$ through $R_5$ which are alkyl groups containing at least one oxygen atom, namely examples of $R_1$ through $R_5$ represented by $-C_mH_{2m}OC_{n-m}H_{2(n-m)+1}$ ($n \geq 2$; $n \geq m \geq 0$) are described below. Herein, substituents except $-C_mH_{2m}OC_{n-m}H_{2(n-m)+1}$ are H or an alkyl group, while the total sum of the carbon atoms thereof is 3 or more to 24 or less. The introduction of the oxygen atom (O) makes the compound ready dissolvable in aqueous solvents, so that the compound is frequently used in a developing solution more preferably.

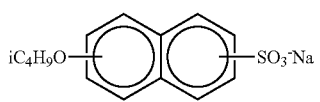 (I-s)

 (I-t)

 (I-u)

 (I-v)

 (I-w)

 (I-x)

 (I-y)

 (I-z)

 (I-aa)

 (I-ab)

 (I-ac)

 (I-ad)

 (I-ae)

When the total sum of the carbon atoms of $R_6$ through $R_{10}$ in the formula is 3 or more in the compound corresponding to the formula (II), the effect can be exerted. When the total sum of the carbon atoms of $R_6$ through $R_{10}$ is larger, the hydrophobic part occupies such a large area that the compound is hardly dissolved in aqueous developing solutions. Even when auxiliary dissolution agents helping dissolution, such as organic solvents, are mixed into water, in this case, the surfactant cannot be dissolved within a suitable mix range. Generally, the total sum of the carbon atoms of $R_6$ and $R_{10}$ are 24 or less. More preferably, the total sum of the carbon atoms of $R_6$ and $R_{10}$ are 3 to 20. In case that $R_6$ through $R_{10}$ are alkyl groups, herein, the structures thereof may be linear or branched.

The total sum of the carbon atoms of $R_6$ and $R_{10}$ in the compound (surfactant) are under influence of materials for use in the photosensitive layer, particularly a binder. In case of a highly hydrophilic binder, the total sum of the carbon atoms of $R_6$ through $R_{10}$ may satisfactorily be relatively small. When a binder at low hydrophilicity is used, the total sum of the carbon atoms of $R_6$ through $R_{10}$ should be larger.

Further, $X_2$ in the compound is specifically a sulfonate salt, a sulfate monoester salt, a carboxylate salt or a phosphate salt. Among them, the effects of a sulfonate salt and a carboxylate salt are particularly high. Among these salts, alkali metal salts are particularly preferable because the alkali metal salts dissolve well in aqueous solvents. Among them, sodium salts and potassium salts are particularly preferable.

More specifically, the compound is exemplified below.

There are shown below compounds where $R_6$ through $R_{10}$ are alkyl groups without any oxygen atom.

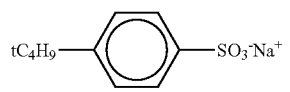
(II-a)

(II-b)

(II-c)

(II-d)

(II-e)

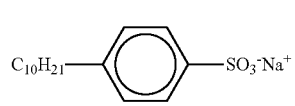
(II-f)

(II-g)

(II-h)

(II-i)

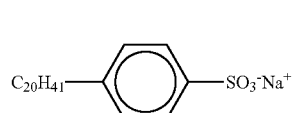
(II-j)

(II-k)

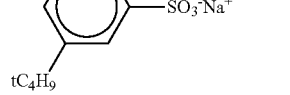
(II-l)

-continued

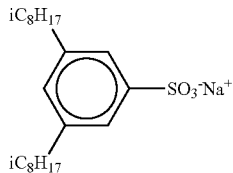
(II-m)

(II-n)

(II-o)

(II-p)

(II-q)

(II-r)

(II-s)

(II-t)

(II-u)

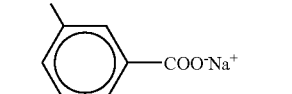
(II-v)

Examples of $R_6$ through $R_{10}$ which contain at least one alkyl group with an oxygen atom, namely examples of $R_6$ through $R_{10}$ represented by —$C_mH_{2m}OC_{n-m}H_{2(n-m)+1}$ ($n \geq 2$; $n \geq m \geq 0$) are described below. Herein, substituents except —$C_mH_{2m}OC_{n-m}H_{2(n-m)+1}$ are H or an alkyl group, while the total sum of the carbon atoms thereof is 3 or more to 24 or less. The introduction of the oxygen atom (O) makes the compound ready dissolvable in aqueous solvents, so that the compound is frequently used in a developing solution more preferably.

(II-w) 

(II-x) 

(II-y) 

(II-z) 

(II-aa) 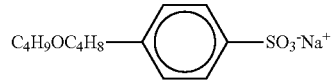

(II-ab) 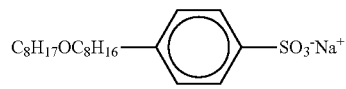

(II-ac) 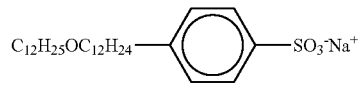

(II-ad) 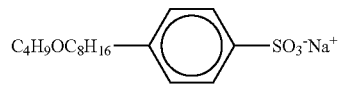

(II-ae) 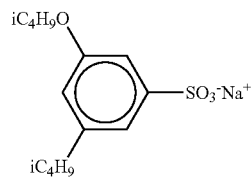

(II-af) 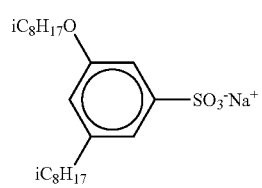

(II-ag) 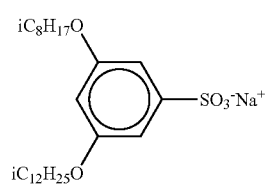

(II-ah) 

(II-ai) 

(II-aj) 

(II-ak) 

(II-al) 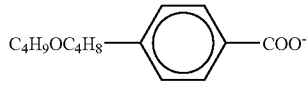

(II-am) 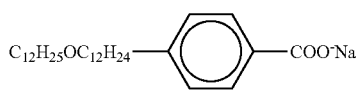

(II-an)

The aforementioned anionic surfactant generally exerts the effect at 1% by mass in total in the developing solution of the invention. Depending on the type of a surfactant, the total mass may be an acceptable level but not a satisfactory level. Preferably, the surfactant is essentially added at an amount of 3% or more, preferably 5% or more.

The developing solution of the invention may contain a water-soluble polymer compound other than the specific anion surfactant and may carry out a treatment for allowing for no sensitization to lipid, simultaneously with a developing treatment.

The water-soluble polymer compound for use includes for example soybean polysaccharides, modified starch, gum arabic, dextrin, cellulose derivatives (for example, carboxymethyl cellulose, carboxyethyl cellulose, and methyl cellulose), and modified products thereof, pullulan, polyvinyl alcohol and derivatives thereof, polyvinyl pyrrolidone, polyacrylamide and acrylamide copolymers, vinyl methyl ether/maleic anhydride copolymers, vinyl acetate/maleic anhydride copolymers, and styrene/maleic anhydride copolymers.

As the soybean polysaccharides, conventionally known ones can be used. For example, a commercially available product Soyafive under the trade name (manufactured by Fuji Oil Co. Ltd.) is listed, of which various grades may be used. Soyafive at a viscosity within a range of 10- to 100 mPa/sec as the viscosity thereof in the form of an aqueous solution at 10% by mass is preferable.

As the modified starch, preference is given to a modified starch represented by the following general formula (III). As the starch represented by the general formula (III), there may be used any starch from corn, potato, tapioca, rice and wheat. These starch types can be modified by for example a process of degrading starch within a range of 5 to 30 glucose residues per one starch molecule with an acid or an enzyme or the like and then adding oxypropylene in an alkali.

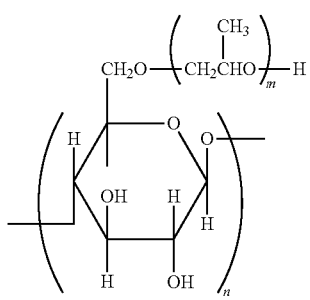

(III)

(In the formula, the etherification level (substitution level) per glucose unit is within a range of 0.05 to 1.2, where "n" represents an integer of 3 to 30 and "m" represents an integer of 1 to 3.)

Among the water-soluble polymer compounds described above, for example, soybean polysaccharides, modified starch, gum arabic, dextrin, carboxymethyl cellulose, and polyvinyl alcohol are particularly preferable.

Two or more types of the water-soluble polymer compound may be used in combination. The content of the water-soluble polymer compounds in the developing solution is preferably 0.1 to 20% by mass, more preferably 0.5 to 10% by mass.

In accordance with the invention, the water-soluble polymer compounds are used for a treatment for allowing for no sensitization to lipid, simultaneously for a developing treatment with the specific anion surfactant-containing developing solution at a specific pH, which also contains the water-soluble polymer compounds. So as to securely carry out the treatment for allowing for no sensitization to lipid, additionally, the water-soluble polymer compounds may be used in such a manner that a printing plate is put in contact to an aqueous solution containing the water-soluble polymer compounds after the developing treatment with the developing solution.

Besides those described above, the developing solution in accordance with the invention may contain for example moistening agents, preservatives, chelating compounds, defoaming agents, organic acids, organic solvents, inorganic acids and inorganic salts.

As the moistening agents, there may preferably be used ethylene glycol, propylene glycol, triethylene glycol, butylene glycol, hexylene glycol, diethylene glycol, dipropylene glycol, glycerin, trimethylolpropane, and diglycerin. These moistening agents may be used singly or in combination with two or more thereof. Generally, the moistening agents are used at an amount of 0.1 to 5% by mass on the total mass basis of the developing solution.

As the preservatives, for example, there may preferably be used phenol or derivatives thereof, formalin, imidazole derivatives, sodium dehydroacetate, 4-isothiazolin-3-one derivatives, benzoisothiazolin-3-one, 2-methyl-4-isothiazolin-3-one, benzotriazole derivatives, amidine guanidine derivatives, quaternary ammonium salts, derivatives of pyridine, quinoline, guanidine, etc., diazine, triazole derivatives, oxazole, oxazine derivatives, nitrobromoalcohol-series 2-bromo-2-nitropropan-1,3-diol, 1,1-dibromo-1-nitro-2-ethanol, and 1,1-dibromo-1-nitro-2-propanol.

A preservative should be added at an amount to allow stable exertion of the efficacy on bacteria, fungi or yeast, which varies depending on the type of the bacteria, the fungi or the yeast. Preferably, the amount is within a range of 0.01 to 4% by mass of the developing solution used. Additionally, two or more types of preservatives are used in combination so as to enable the exertion of the efficacy on various types of fungi and bacteria.

The chelating compound includes for example ethylenediaminetetraacetic acid, the potassium salt thereof and the sodium salt thereof; diethylenetriaminepentaacetic acid, the potassium salt thereof and the sodium salt thereof; triethylenetetramine hexaacetic acid, the potassium salt thereof, and the sodium salt thereof; hydroxyethylethylenediamine triacetic acid, the potassium salt thereof and the sodium salt thereof; nitrotriacetic acid, and the sodium salt thereof; 1-hydroxyethane-1,1-diphosphonic acid, the potassium salt thereof and the sodium salt thereof; organic phosphonates or phosphonoalkane tricarboxylates, such as aminotri(methylenephosphonic acid), the potassium salt thereof and the sodium salt thereof. Organic amine salts are also effective in place of the sodium salts and potassium salts of the chelating agents described above.

As the chelating agents, chelating agents stably existing in the composition of the developing solution without any inhibition of the printing performance are selected. The amount thereof to be added is preferably 0.001 to 1.0% by mass of the developing solution used.

As the defoaming agent, there may be used self-emulsion types and emulsion types of general silicone series and compounds of nonionic surfactants at HLB of 5 or less. Silicone defoaming agents are preferable. Among them, the emulsion dispersion types thereof and the solubilization type thereof may all be used.

The content of the defoaming agent is preferably within a range of 0.001 to 1.0% by mass of the developing solution used.

The organic acid includes for example citric acid, acetic acid, oxalic acid, malonic acid, salicylic acid, caprylic acid, tartaric acid, malic acid, lactic acid, levulinic acid, p-toluenesulfonic acid, xylenesulfonic acid, phytic acid, and organic phosphonic acid. The organic acid may also be used in the form of an alkali metal salt thereof or an ammonium salt thereof. The content of the organic acid is preferably 0.01 to 0.5% by mass on the total mass of the developing solution.

The organic solvent to be possibly contained therein includes for example aliphatic hydrocarbons [hexane, heptane, "ISOPAR E, H and G" (manufactured by Esso) or gasoline, kerosene or the like], aromatic hydrocarbons (toluene, xylene, etc.), or halogenated hydrocarbons (methylene dichloride, ethylene dichloride, trichlene, monochlorobenzene, etc.) and polar solvents.

The polar solvents include for example alcohols (methanol, ethanol, propanol, isopropanol, benzyl alcohol, ethylene glycol monomethyl ether, 2-ethoxyethanol, diethylene glycol monoethyl ether, diethylene glycol monohexyl ether, triethylene glycol monomethyl ether, propylene glycol monoethyl ether, propylene glycol monomethyl ether, polyethylene glycol monomethyl ether, polypropylene glycol, tetraethylene glycol, ethylene glycol monobutyl ether, ethylene glycol monobenzyl ether, ethylene glycol monophenyl ether, methylphenylcarbinol, n-amyl alcohol, methylamyl alcohol, etc.), ketones (acetone, methyl ethyl ketone, ethyl butyl ketone, methyl isobutyl ketone, cyclohexanone, etc.), esters (ethyl acetate, propyl acetate, butyl acetate, amyl acetate, benzyl acetate, methyl lactate, butyl lactate, ethylene glycol monobutyl acetate, propylene glycol monomethyl ether acetate, diethylene glycol acetate, diethyl phthalate, butyl levulinate, etc.), and others (triethyl phosphate, tricresyl phosphate, N-phenylethanolamine, N-phenyldiethanolamine, etc.).

When the organic solvent is not soluble in water, the organic solvent may sometimes be solubilized in water, using a surfactant and the like, for use. When the organic solvent is contained in the developing solution, the concentration of the solvent is preferably less than 40% by mass from the standpoints of safety concerns and inflammability.

The inorganic acid and the inorganic salt include for example, phosphoric acid, metaphosphoric acid, ammonium dihydrogen phosphate, diammonium hydrogen phosphate, sodium dihydrogen phosphate, disodium hydrogen phosphate, potassium dihydrogen phosphate, dipotassium hydrogen phosphate, sodium tripolyphosphate, potassium pyrophosphate, sodium hexametaphosphate, magnesium nitrate, sodium nitrate, potassium nitrate, ammonium nitrate, sodium sulfate, potassium sulfate, ammonium sulfate, sodium sulfite, ammonium sulfite, sodium hydrogen sulfate, and nickel sulfate. The content of the inorganic salt is preferably 0.01 to 0.5% by mass on the basis of the total mass of the developing solution.

The developing solution for use in accordance with the invention is obtained by dissolving or dispersing the individual components in water, if necessary. The concentration of solids in the developing solution is preferably one to 20% by mass. A concentrate solution thereof may be prepared preliminarily, for dilution with water on use.

The developing solution for use in accordance with the invention is at pH 2 to 10. From the standpoints of the developing performance and the dispersibility of the photosensitive layer, the developing solution is advantageously preset to a higher pH value. In view of printing performance, particularly in view of stain, the pH value is advantageously preset to a lower value. Therefore, the pH is preferably 3 to 8, more preferably 3.5 to 7.

The process of putting the developing solution in contact with the lithography printing plate precursor in accordance with the invention includes a manual process, a dipping process and a mechanical process such as horizontal transfer process.

The manual process includes for example a step of rubbing the whole surface of the lithography printing plate precursor with a sponge or absorbent cotton sufficiently containing an aqueous solution of the developing solution to put the developing solution in contact with the lithography printing plate precursor and a subsequent step of sufficiently rinsing the lithography printing plate precursor in water after the termination of the treatment in the aforementioned step. The dipping process includes for example a step of dipping and agitating a lithography printing plate precursor in a bat or a deep tank containing an aqueous solution of the developing solution for about 60 seconds and a subsequent step of sufficiently rinsing the lithography printing plate precursor in water while rubbing the plate with absorbent cotton or a sponge.

For the development process, an apparatus with a simplified structure and a simplified process is used according to the development process in accordance with the invention. Compared with conventional alkaline development systems, the influence of carbon dioxide in atmosphere is less, so that the sealing level of the solution from atmosphere can be reduced. In case of carrying out a treatment for allowing for no sensitization to lipid, simultaneously with development, additionally, the rinsing step in water and the step for the treatment for allowing for no sensitization to lipid as in the related art are not necessarily arranged. A tank with a single bath or with two baths at most is satisfactorily arranged. Even when none of any agent for allowing for no sensitization to lipid such as a water-soluble resin is charged therein, a treatment for allowing for no sensitization to lipid is done with a gum solution and the like in the related art at the following step without any rinsing step in water, so that the same performance as in the related-art systems can be obtained. Because a developing solution in one solution without any agent for allowing for no sensitization to lipid such as a water-soluble resin charged therein can be arranged in a single bath alone for printing, such system may be arranged for a simple process although the developing solution might deteriorate the surface protection and the treatment for allowing for no sensitization to lipid. When two baths are arranged even in this case, specifically, a system can be constructed. In such manner, the apparatus cost can be reduced and arranged in a space far smaller than the space required for the apparatuses in the related art. For the developing treatment, generally, a rubbing member is essential. Therefore, a rubbing member such as brush is arranged in a developing bath for removing a non-image part on a photosensitive layer.

The load on a printing member such as brush is significantly reduced with a surfactant for use in accordance with the invention. Generally, the non-image part cannot be removed unless the development with a developing solution in a region at low alkalinity to acidity is done under strong rubbing conditions so as to remove the non-image part on the photosensitive layer. With the developing solution using a surfactant for use in accordance with the invention, however, development can be done, using a rubbing member similar to general rubbing members for use for alkaline development under similar rubbing conditions (for example, rotation number and brush pressure).

It is needless to say that gum coaters and automatic developing machines known for PS plate and CTP plate may also be used in the system. In case of using a conventional automatic developing machine, for example, the following modes are all applicable: a mode of drawing the developing solution charged in a developing tank with a pump and spraying the developing solution from a spray nozzle; a mode of dipping and transferring a printing plate in a tank filled with the developing solution with a guide roll and the like; and a mode of supplying a necessary volume of a developing solution substantially unused per printing plate for development, namely so-called disposable mode. For any of the modes, a rubbing mechanism with for example brush and molton is preferably preset. Additionally, an apparatus with a part for laser exposure and an automatic developing machine in integration may also be used.

(Lithography Printing Plate Precursor)

The lithography printing plate precursor for use in the plate-production process in accordance with the invention includes a negative type image recording layer on a support, which can be removed with a printing ink, moistening water or both of the two and is cured via exposure. From the standpoints of ready development and good printing resistance, the negative type image recording layer is a polymerizable image recording layer containing (1) a polymerization initiator, (2) a polymerizable compound, and (3) a hydrophobic binder as the essential components. The constitution elements of the lithography printing plate precursor, such as image recording layer and support as well as ingredients therein are described below.

(Image Recording Layer)
(Polymerization Initiator)

The polymerization initiator for use in accordance with the invention is a compound generating radicals or acids via light or thermal energy to initiate or promote the polymerization of compounds with polymerizable unsaturated groups. Such polymerization initiator is appropriately selected from for example known radical generators or acid generators or compounds with bonds with small binding- and dissociation energies.

The compound generating radicals or acids include for example organic halogen compounds, carbonyl compounds, organic peroxides, azo-series compounds, azide compounds, metallocene compounds, hexaarylbiimidazole compounds, organic boron compounds, disulfone compounds, oxime ester compounds, and onium salt compounds.

The organic halogen compounds specifically include for example compounds described in Wakabayashi, et al., "Bull. Chem. Soc. Japan", 42, 2924 (1969); the specification of U.S. Pat. No. 3,905,815; the official gazettes of JP-B-Sho 46-4605, JP-A-Sho 48-36281, JP-A-Sho 53-133428, JP-A-Sho 55-32070, JP-A-Sho 60-239736, JP-A-Sho 61-169835, JP-A-Sho 61-169837, JP-A-Sho 62-58241, JP-A-Sho 62-212401, JP-A-Sho 63-70243, and JP-A-Sho 63-298339; and M. P. Hutt, "Journal of Heterocyclic Chemistry", 1 (No. 3), (1970). Among them, oxazole compounds and S-triazine compounds with trihalomethyl groups in substitution are preferable.

More preferable are s-triazine compounds and oxadiazole derivatives where at least one of mono-, di- or tri-halogen-substituted methyl groups is bound to the s-triazine ring and the oxadiazole ring, respectively. Specifically, such preferable compounds include for example 2,4,6-tris(monochloromethyl)-s-triazine, 2,4,6-tris(dichloromethyl)-s-triazine, 2,4,6-tris(trichloromethyl)-s-triazine, 2-methyl-4,6-bis(trichloromethyl)-s-triazine, 2-n-propyl-4,6-bis(trichloromethyl)-s-triazine, 2-(α,α,β-trichloroethyl)-4,6-bis(trichloromethyl)-s-triazine, 2-(3,4-epoxyphenyl)-4,6-bis(trichloromethyl)-s-triazine, 2-[1-(p-methoxyphenyl)-2,4-butadienyl]-4,6-bis(trichloromethyl)-s-triazine, 2-styryl-4,6-bis(trichloromethyl)-s-triazine, 2-(p-methoxystyryl)-4,6-bis(trichloromethyl)-s-triazine, 2-(p-i-propyloxystyryl)-4,6-bis(trichloromethyl)-s-triazine, 2-(p-tolyl)-4,6-bis(trichloromethyl)-s-triazine, 2-(4-methoxynaphthyl)-4,6-bis(trichloromethyl)-s-triazine, 2-phenylthio-4,6-bis(trichloromethyl)-s-triazine, 2-benzylthio-4,6-bis(trichloromethyl)-s-triazine, 2,4,6-tris(dibromomethyl)-s-triazine, 2,4,6-tris(tribromomethyl)-s-triazine, 2-methyl-4,6-bis(tribromomethyl)-s-triazine, 2-methoxy-4,6-tris(tribromomethyl)-s-triazine, and the following compounds.

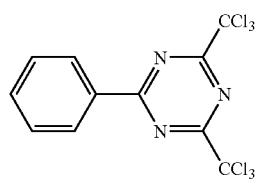
(I)-1

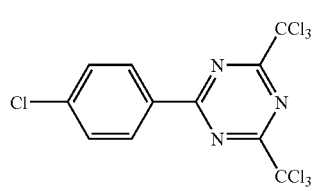
(I)-2

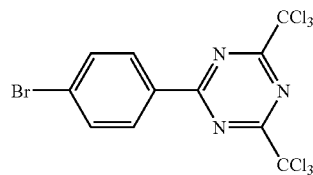
(I)-3

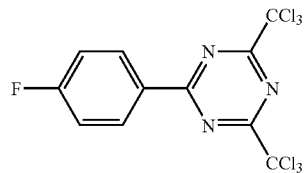
(I)-4

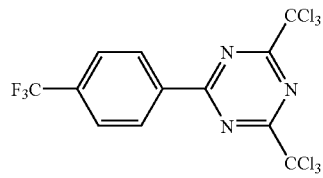
(I)-5

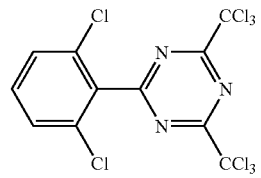
(I)-6

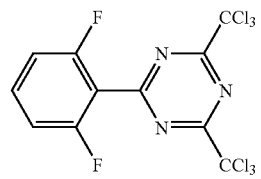
(I)-7

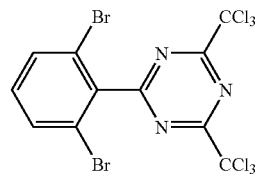
(I)-8

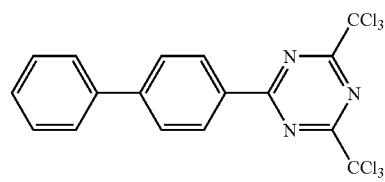
(I)-9

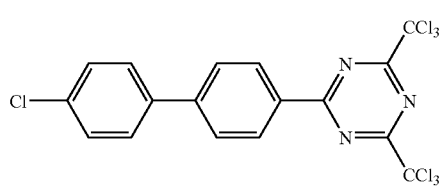
(I)-10

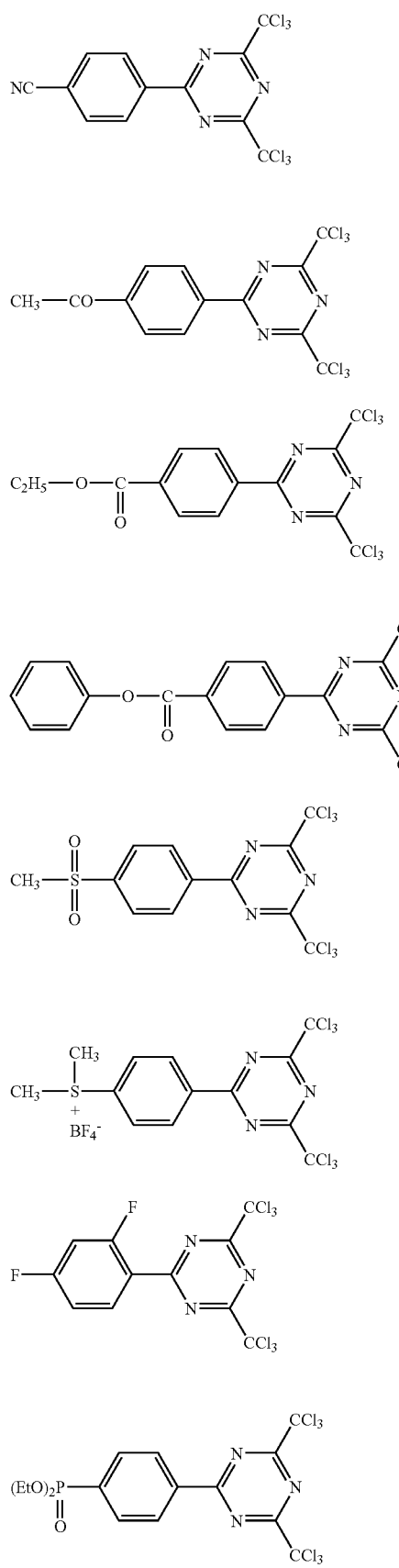
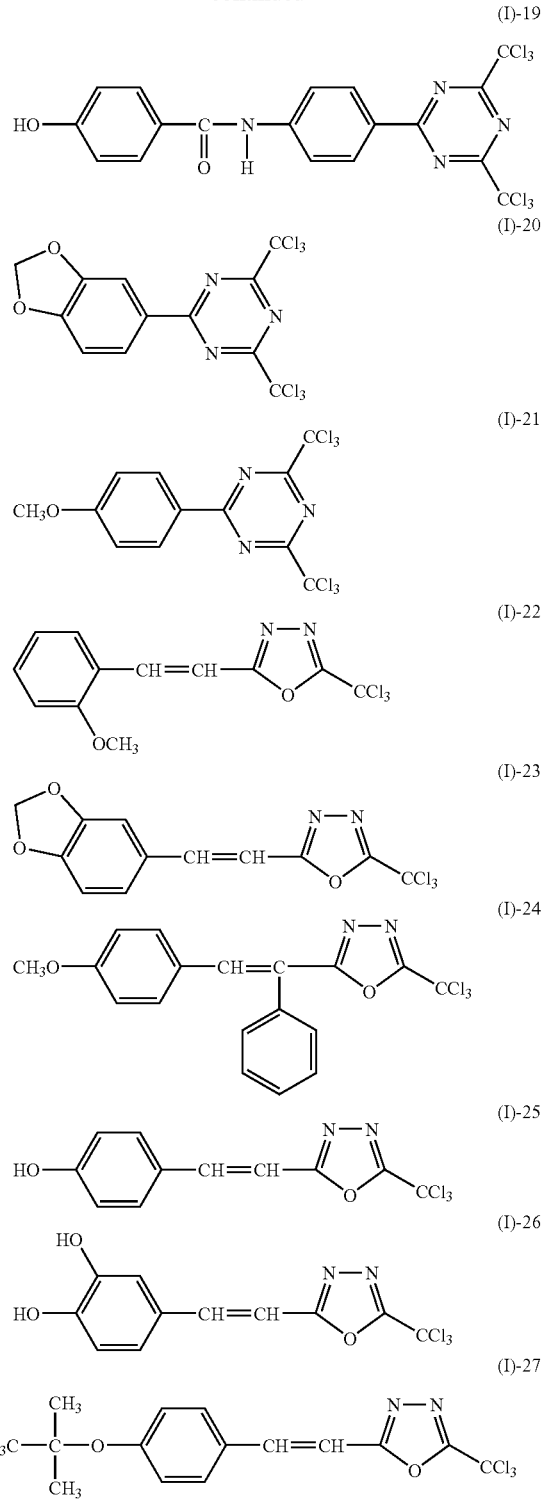

The carbonyl compounds include for example benzophenone, Michler's ketone, and benzophenone derivatives such as 2-methylbenzophenone, 3-methylbenzophenone, 4-methylbenzophenone, 2-chlorobenzophenone, 4-bromobenzophenone, and 2-carboxybenzophenone; acetophenone derivatives such as 2,2-dimethoxy-2-phenylacetophenone, 2,2-diethoxyacetophenone, 1-hydroxycyclohexylphenylketone, α-hydroxy-2-methylphenylpropanone, 1-hydroxy-1- methylethyl-(p-isopropylphenyl)ketone, 1-hydroxy-1-(p-dodecylphenyl)ketone, 2-methyl-(4'-(methylthio)phenyl)-2-morpholino-1-propanone, and 1,1,1-trichloromethyl-(p-butylphenyl)ketone; thioxanthone and thioxanthone derivatives such as 2-ethylthioxanthone, 2-isopropylthioxanthone, 2-chlorothioxanthone, 2,4-dimethylthioxanthone, 2,4-diethylthioxanthone, and 2,4-diisopropylthioxanthone; benzoate ester derivatives such as p-dimethylaminobenzoate ethyl ester, and p-diethylaminobenzoate ethyl ester.

As the azo compounds, for example, the azo compounds described in the official gazette of JP-A-Hei 8-108621 may be used.

The organic peroxide includes for example trimethylcyclohexanone peroxide, acetylacetone peroxide, 1,1-bis(tert-butylperoxy)-3,3,5-trimethylcyclohexane, 1,1-bis(tert-butylperoxy)cyclohexane, 2,2-bis(tert-butylperoxy)butane, tert-butyl hydroperoxide, cumene hydroperoxide, diisopropylbenzene hydroperoxide, 2,5-dimethylhexane-2,5-dihydroperoxide, 1,1,3,3-tetramethylbutyl hydroperoxide, tert-butylcumyl peroxide, dicumyl peroxide, 2,5-dimethyl-2,5-di(tert-butylperoxy)hexane, 2,5-oxanoyl peroxide, succinyl peroxide, benzoyl peroxide, 2,4-dichlorobenzoyl peroxide, diisopropyl peroxydicarbonate, di-2-ethylhexyl peroxydicarbonate, di-2-ethoxyethyl peroxydicarbonate, dimethoxyisopropyl peroxycarbonate, di(3-methyl-3-methoxybutyl) peroxydicarbonate, tert-butyl peroxyacetate, tert-butyl peroxypivalate, tert-butyl peroxyneodecanoate, tert-butyl peroxyoctanoate, tert-butyl peroxylaurate, tertiary carbonate, 3,3',4,4'-tetra-(t-butylperoxycarbonyl)benzophenone, 3,3',4,4'-tetra-(t-hexylperoxycarbonyl)benzophenone, 3,3',4,4'-tetra-(p-isopropylcumylperoxycarbonyl)benzophenone, carbonyl di(t-butylperoxy dihydrogen diphthalate) and carbonyl di(t-hexylperoxy dihydrogen diphthalate).

The metallocene compounds include for example various titanocene compounds described in the official gazettes of JP-A-Sho 59-152396, JP-A-Sho 61-151197, JP-A-Sho 63-41484, JP-A-Hei 2-249, JP-A-Hei 2-4705, and JP-A-Hei 5-83588, for example di-cyclopentadienyl-Ti-bis-phenyl, di-cyclopentadienyl-Ti-bis-2,6-difluorophen-1-yl, di-cyclopentadienyl-Ti-bis-2,4-difluorophen-1-yl, di-cyclopentadienyl-Ti-bis-2,4,6-trifluorophen-1-yl, di-cyclopentadienyl-Ti-bis-2,3,5,6-tetrafluorophen-1-yl, di-cyclopentadienyl-Ti-bis-2,3,4,5,6-pentafluorophen-1-yl, di-methylcyclopentadienyl-Ti-bis-2,6-difluorophen-1-yl, di-methylcyclopentadienyl-Ti-bis-2,4,6-trifluorophen-1-yl, di-methylcyclopentadienyl-Ti-bis-2,3,5,6-tetrafluorophen-1-yl, di-methylcyclopentadienyl-Ti-bis-2,3,4,5,6-pentafluorophen-1-yl, and the iron-allene complexes described in the official gazettes of JP-A-Hei 1-304453 and JP-A-Hei 1-152109.

The hexaarylbiimidazole compounds include for example various compounds described in for example the official gazette of JP-B-Hei 6-29285 and the specifications of U.S. Pat. No. 3,479,185, U.S. Pat. No. 4,311,783, and U.S. Pat. No. 4,622,286, specifically including for example 2,2'-bis(o-chlorophenyl)-4,4',5,5'-tetraphenylbiimidazole, 2,2'-bis(o-bromophenyl)-4,4',5,5'-tetraphenylbiimidazole, 2,2'-bis(o,p-dichlorophenyl)-4,4',5,5'-tetraphenylbiimidazole, 2,2'-bis(o-chlorophenyl)-4,4',5,5'-tetra(m-methoxyphenyl) biimidazole, 2,2'-bis(o,o'-dichlorophenyl)-4,4',5,5'-tetraphenylbiimidazole, 2,2'-bis(o-nitrophenyl)-4,4',5,5'-tetraphenylbiimidazole, 2,2'-bis(o-methylphenyl)-4,4',5,5'-tetraphenylbiimidazole, and 2,2'-bis(o-trifluorophenyl)-4,4',5,5'-tetraphenylbiimidazole.

The organic boron compounds include for example organic boron compounds described in for example the official gazettes of JP-A-Sho 62-143044, JP-A-Sho 62-150242, JP-A-Hei 9-188685, JP-A-Hei 9-188686, JP-A-Hei 9-188710, JP-A-2000-131837, and JP-A-2002-107916, the specification of Japanese Patent 2764769, the official gazette of JP-A-2002-116539, and Kunz, Martin, "Rad Tech '98. Proceeding Apr. 19-22, 1998, Chicago"; organic boron sulfonium complexes or organic boron oxosulfonium complexes described in the official gazettes of JP-A-Hei 6-157623, JP-A-Hei 6-175564 and JP-A-Hei 6-175561; organic boron iodonium complexes described in the official gazettes of JP-A-Hei 6-175554 and JP-A-Hei 6-175553; organic boron phosphonium complexes described in the official gazette of JP-A-Hei 9-188710; and organic boron transition metal coordinate complexes described in the official gazettes of JP-A-Hei 6-348011, JP-A-Hei 7-128785, JP-A-Hei 7-140589, JP-A-Hei 7-306527 and JP-A-Hei 7-292014.

The disulfone compounds include compounds described in for example the official gazettes of JP-A-Sho 61-166544 and JP-A-2003-328465.

The oxime ester compounds include for example compounds described in J. C. S. Perkin II (1979) 1653-1660, J. C. S. Perkin II (1979) 156-162, and "Journal of Photopolymer Science and Technology" (1995), 202-232, and the official gazette of JP-A-2000-66385 and also include the compound described in the official gazette of JP-A-2000-80068, specifically including compounds represented by the following structural formulas.

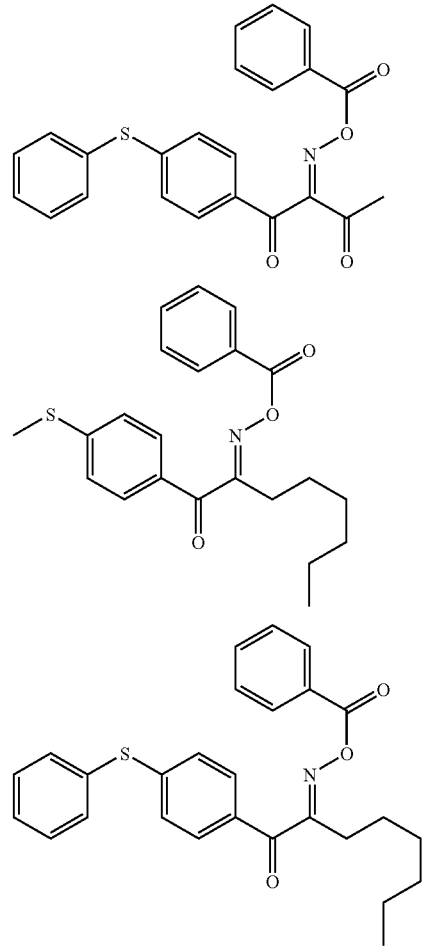

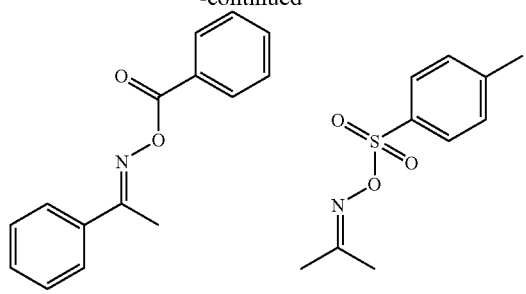
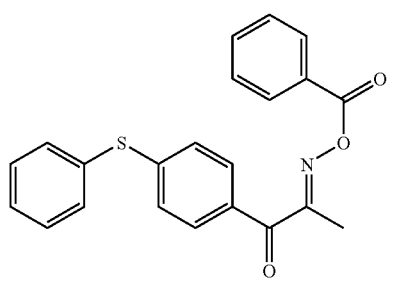
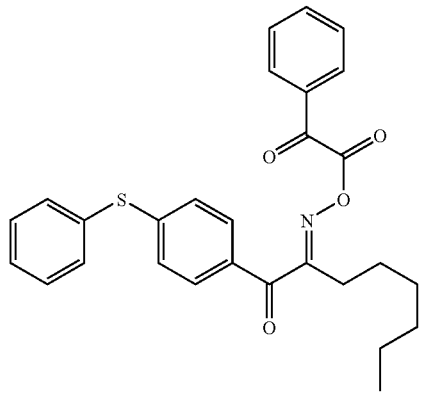
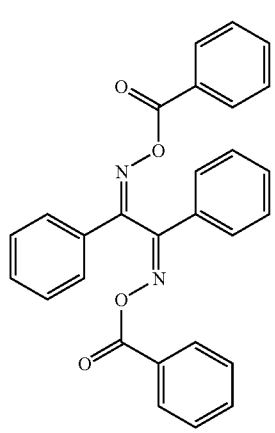
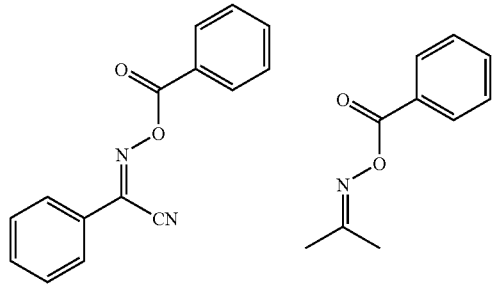
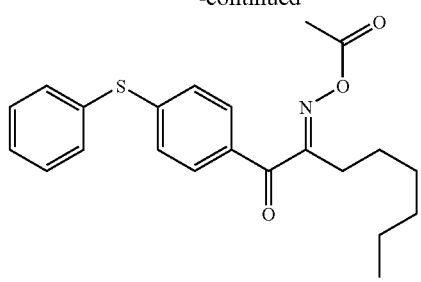
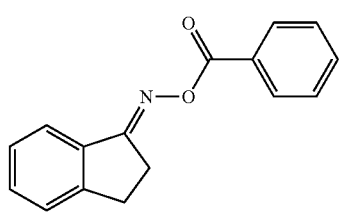
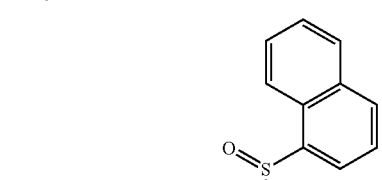
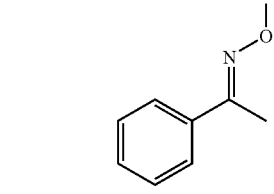
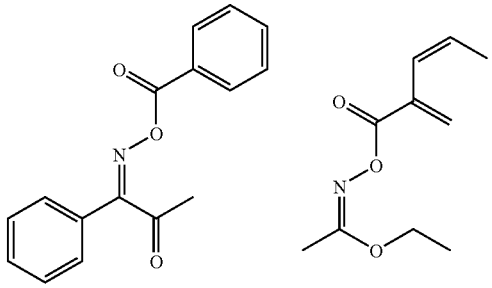
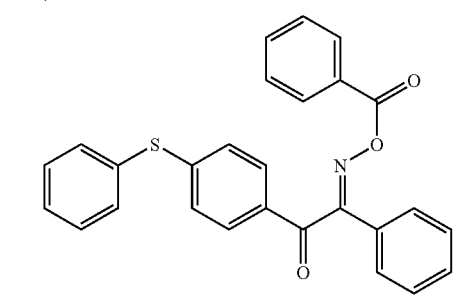
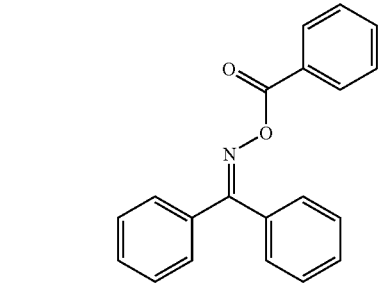

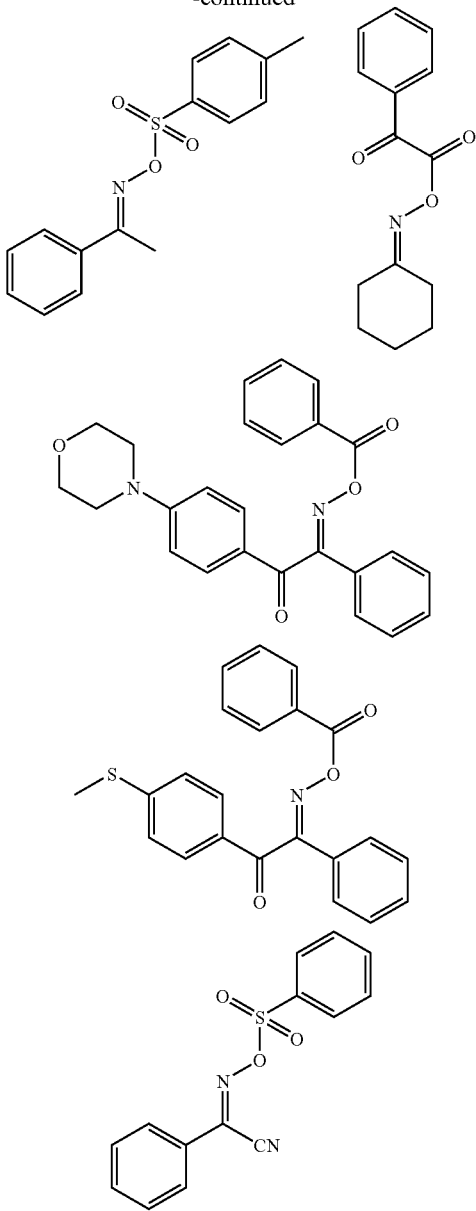

The onium salt compounds include for example the diazonium salts described in S. I. Schlesinger, Photogr. Sci. Eng., 18, 387 (1974), and T. S. Bal, et al., Polymer, 21, 423(1980); ammonium salts described in for example the specification of U.S. Pat. No. 4,069,055 and the official gazette of JP-A-Hei 4-365049; the phosphonium salts described in the specifications of U.S. Pat. Nos. 4,069,055, and 4,069,056; iodonium salts described in the specifications of EP 104, 143, U.S. Pat. No. 339,049, and U.S. Pat. No. 410,201 and in the official gazettes of JP-A-Hei 2-150848 and JP-A-Hei 2-296514; the sulfonium salts described in the specifications of EP 370, 693, EP 390,214, EP 233, 567, EP 297, 443, EP 297,442, U.S. Pat. No. 4,933,377, U.S. Pat. No. 161,811, U.S. Pat. No. 410,201, U.S. Pat. No. 339,049, U.S. Pat. No. 4,760,013, U.S. Pat. No. 4,734,444, U.S. Pat. No. 2,833,827, German Patent 2,904, 626, German Patent 3,604,580, and German Patent 3,604, 581; the selenonium salts described in J. V. Crivello, et al., Macromolecules, 10(6), 1307(1977), J. V. Crivello, et al., J. Polymer Sci., Polymer Chem. Ed., 17, 1047(1979); and the onium salts such as the arsonium salt described in C. S. Wen, et al., Teh. Proc. Conf. Rad. Curing ASIA, p. 478, Tokyo, October (1988).

The onium salt preferable for use in accordance with the invention includes the onium salts represented by the following general formulas (RI-I) through (RI-III).

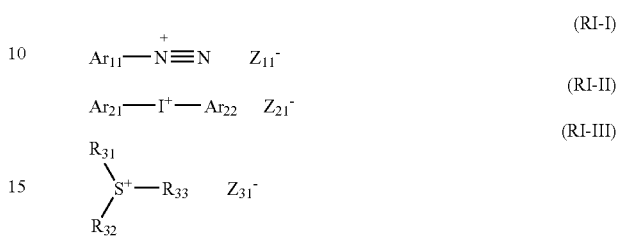

(RI-I)

(RI-II)

(RI-III)

In the formula (RI-I), $A_{r11}$ represents an aryl group with 20 or less carbon atoms, which may or may not have one to 6 substituents, where preferable such substituents include for example alkyl groups with one to 12 carbon atoms, alkenyl groups with one to 12 carbon atoms, alkynyl groups with one to 12 carbon atoms, aryl groups with one to 12 carbon atoms, alkoxy groups with one to 12 carbon atoms, aryloxy groups with one to 12 carbon atoms, halogen atoms, alkylamino groups with one to 12 carbon atoms, dialkylamino groups with one to 12 carbon atoms, alkylamide groups or arylamide groups with one to 12 carbon atoms, carbonyl group, carboxyl group, cyano group, sulfonyl group, thioalkyl groups with one to 12 carbon atoms, and thioaryl groups with one to 12 carbon atoms. $Z_{11}^-$ represents a monovalent anion, specifically including for example halogen ions, perchlorate ion, hexafluorophosphate ion, tetrafluoroborate ion, sulfonate ion, sulfinate ion, thiosulfonate ion, and sulfate ion. Among them, perchlorate ion, hexafluorophosphate ion, tetrafluoroborate ion, sulfonate ion and sulfinate ion are preferable from the standpoint of stability.

In the formula (RI-II), $A_{r21}$ and $A_{r22}$ independently represent an aryl group with 20 or less carbon atoms, which may or may not have one to 6 substituents, where preferable such substituents include for example alkyl groups with one to 12 carbon atoms, alkenyl groups with one to 12 carbon atoms, alkynyl groups with one to 12 carbon atoms, aryl groups with one to 12 carbon atoms, alkoxy groups with one to 12 carbon atoms, aryloxy groups with one to 12 carbon atoms, halogen atoms, alkylamino groups with one to 12 carbon atoms, dialkylamino groups with one to 12 carbon atoms, alkylamide groups or arylamide groups with one to 12 carbon atoms, carbonyl group, carboxyl group, cyano group, sulfonyl group, thioalkyl groups with one to 12 carbon atoms, and thioaryl groups with one to 12 carbon atoms. $Z_{21-}$ represents a monovalent anion, specifically including for example halogen ions, perchlorate ion, hexafluorophosphate ion, tetrafluoroborate ion, sulfonate ion, sulfinate ion, thiosulfonate ion, and sulfate ion. Among them, perchlorate ion, hexafluorophosphate ion, tetrafluoroborate ion, sulfonate ion, sulfinate ion and carboxylate ion are preferable from the standpoint of stability and reactivity.

In the formula (RI-III), $R_{31}$, $R_{32}$ and $R_{33}$ independently represent an aryl group, alkyl group, alkenyl group or alkynyl group with 20 or less carbon atoms, which may or may not have one to 6 substituents. Among them, the aryl group is preferable from the standpoint of reactivity and stability. The substituents include for example alkyl groups with one to 12 carbon atoms, alkenyl groups with one to 12 carbon atoms, alkynyl groups with one to 12 carbon atoms, aryl groups with one to 12 carbon atoms, alkoxy groups with one to 12 carbon atoms, aryloxy groups with one to 12 carbon atoms, halogen atoms, alkylamino groups with one to 12 carbon atoms, dialkylamino groups with one to 12 carbon atoms, alkylamide groups or arylamide groups with one to 12 carbon atoms, carbonyl group, carboxyl group, cyano group, sulfonyl group, thioalkyl groups with one to 12 carbon atoms, and thioaryl groups with one to 12 carbon atoms. $Z_{31-}$ represents a monovalent anion, specifically including for example halogen ions, perchlorate ion, hexafluorophosphate ion, tetrafluoroborate ion, sulfonate ion, sulfinate ion, thiosulfonate ion, and sulfate ion. Among them, perchlorate ion, hexafluorophosphate ion, tetrafluoroborate ion, sulfonate ion, sulfinate ion and carboxylate ion are preferable from the standpoint of stability. The carboxylate ion described in the official gazette of JP-A-2001-343742 is more preferable. The carboxylate ion described in the official gazette of JP-A-2002-148790 is particularly preferable.

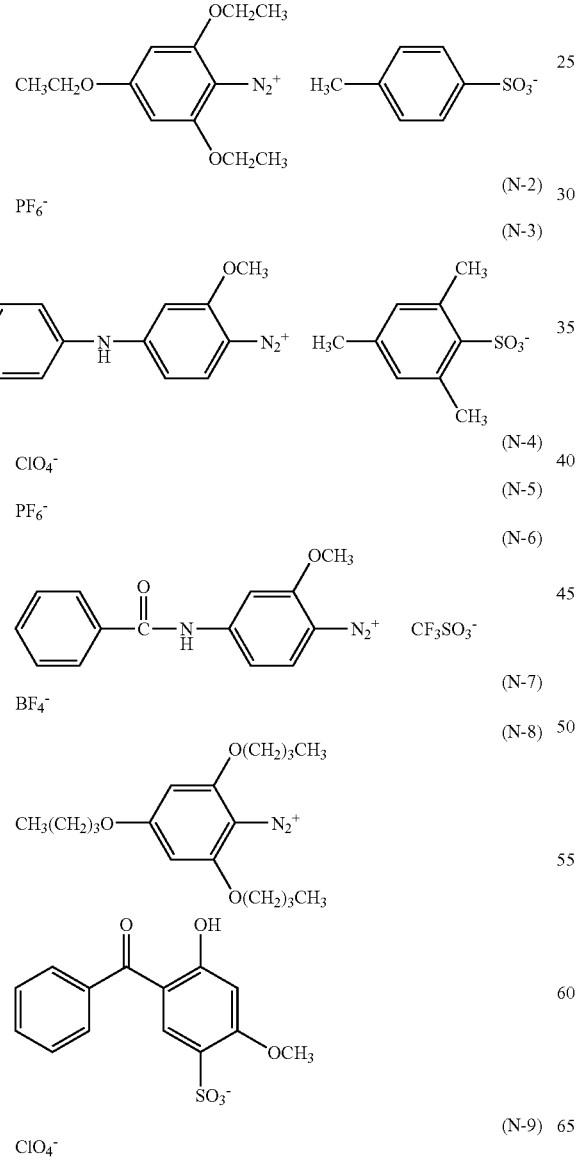
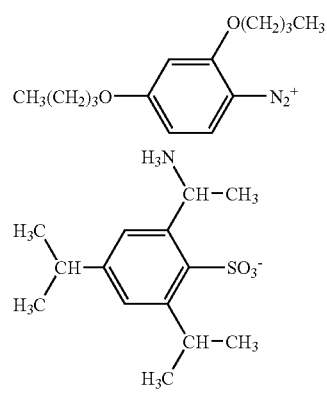
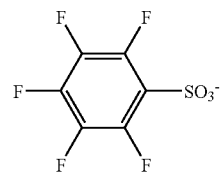
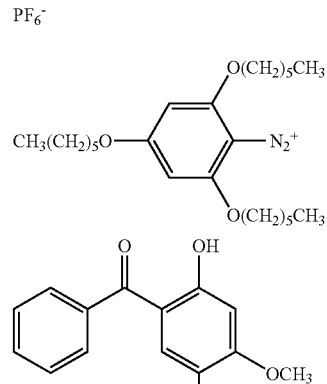
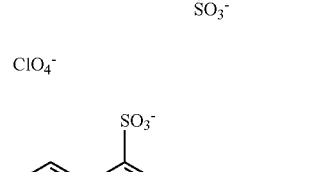
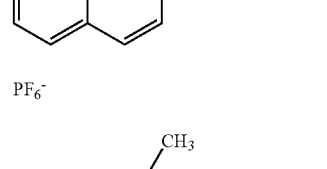
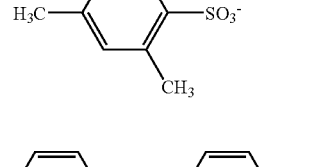

-continued
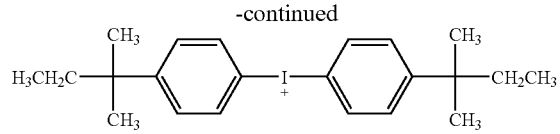
(I-3)
PF$_6^-$
(I-4)
(I-5)
ClO$_4^-$
(I-6)
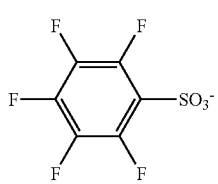
(I-7)
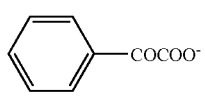
(I-8)
CF$_3$SO$_3^-$
(I-9)
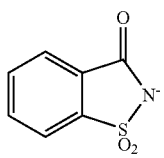
(I-10)
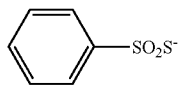
(I-11)
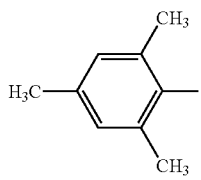
(I-12)
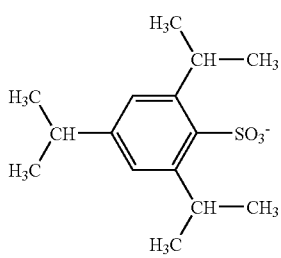
(I-13)
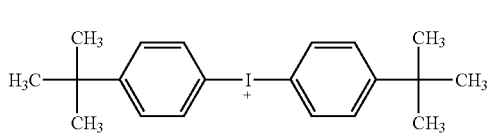
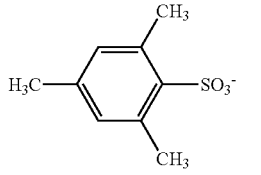
ClO$_4^-$ (I-14)
PF$_6^-$ (I-15)
(I-16)
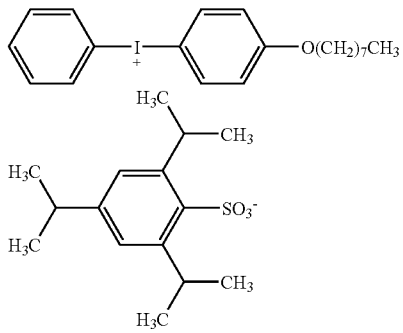
CF$_3$COO$^-$ (I-17)
CF$_3$SO$_3^-$ (I-18)
(I-19)
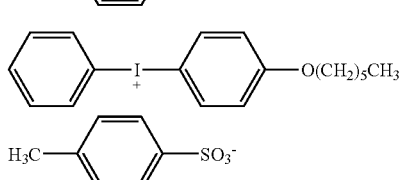
(I-20)
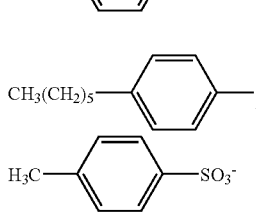
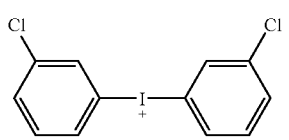
(I-21)
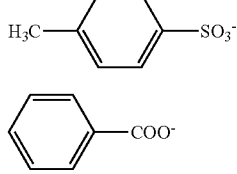
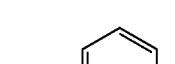
(I-22)
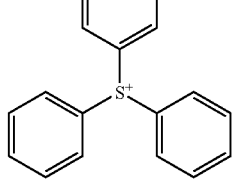 BF$_4^-$
(I-23)
H$_3$C—⟨ ⟩—SO$_3^-$
(I-18)
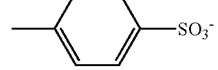
(S-1)
(S-2)
PF$_6^-$
(S-3)
ClO$_4^-$

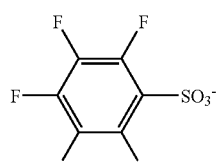
(S-4)

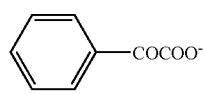
(S-5)

(S-6)

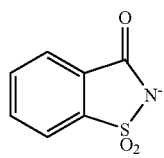
(S-7)

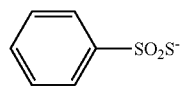
(S-8)

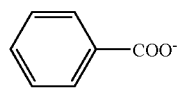
(S-9)

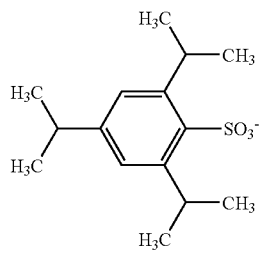
(S-10)

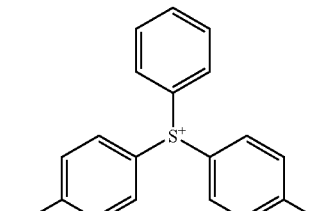
(S-11)

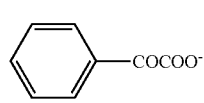
(S-12)

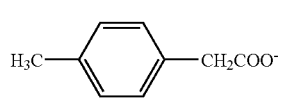
(S-13)

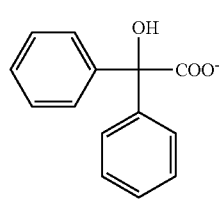

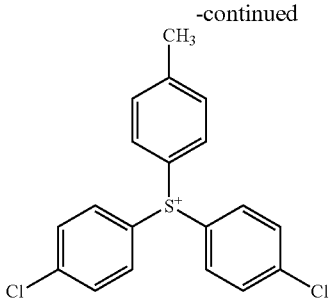
(S-14)

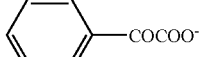
(S-15)

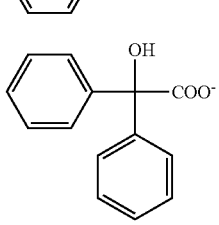
(S-16)

BF$_4^-$ (S-17)

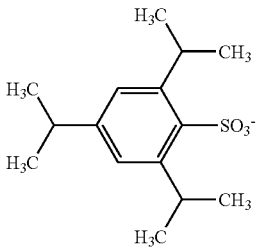

(S-18)

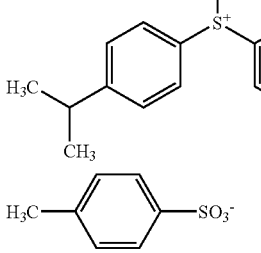

The polymerization initiator includes but is not limited to those described above. From the standpoints of reactivity and stability, in particular, triazine-series initiators, organic halogen compounds, oxime ester compounds, diazonium salts, iodonium salts and sulfonium salts are more preferable.

The polymerization initiators may be used singly or in combination of two or more thereof. Additionally, these polymerization initiators may be added to a layer to which other components are to be added. Otherwise, these polymerization initiators may be added to another layer separately arranged. These polymerization initiators are added at a ratio of preferably 0.1 to 50% by mass, more preferably 0.5 to 30% by mass and particularly preferably 0.8 to 20% by mass of the content of the total solids constituting the image recording layer.

(Polymerizable Compound)

The polymerizable compound for use in accordance with the invention is an addition-polymerizable compound with at least one ethylenic unsaturated double bond and is selected from compounds with at least one ethylenic unsaturated double bond, preferably two or more ethylenic unsaturated double bonds. A group of such compounds is widely known in the industrial field and can be used with no specific limitation.

These are in chemical forms of monomers, prepolymers namely dimers, trimers and oligomers, or mixtures thereof and copolymers thereof. Examples of such monomers and copolymers thereof include unsaturated carboxylic acids (for example, acrylic acid, methacrylic acid, itaconic acid, crotonic acid, isocrotonic acid, maleic acid, etc.), esters thereof and amides thereof. Preferably, there are used esters of unsaturated carboxylic acids with aliphatic polyvalent alcohol compounds, and amides of unsaturated carboxylic acids with aliphatic polyvalent amine compounds. Additionally, addition reaction products of esters or amides of unsaturated carboxylic acids with nucleophilic substituents such as hydroxyl group, amino group, and mercapto group with monofunctional or polyfunctional isocyanate compounds or epoxy compounds, and dehydration condensation products thereof with monofunctional or polyfunctional carboxylic acids are also preferably used. Additionally, addition reaction products of esters or amides of unsaturated carboxylic acids with electrophilic substituents such as isocyanate group and epoxy group with monofunctional or polyfunctional alcohols, amines, and thiols, and substitution products of esters or amides of unsaturated carboxylic acids with eliminable substituents such as halogen groups and tosyloxy group with monofunctional or polyfunctional alcohols, amines and thiols are preferable alike. Still additionally, a group of compounds where unsaturated phosphonic acid, styrene, and vinyl ether are used instead of the unsaturated carboxylic acids may also be used.

Specific examples of the monomer ester of an aliphatic polyvalent alcohol compound and an unsaturated carboxylic acid include acrylate esters such as ethylene glycol diacrylate, triethylene glycol diacrylate, 1,3-butanediol diacrylate, tetramethylene glycol diacrylate, propylene glycol diacrylate, neopentyl glycol diacrylate, trimethylolpropane triacrylate, trimethylolpropane tri(acryloyloxypropyl) ether, trimethylolethane triacrylate, hexanediol diacrylate, 1,4-cyclohexanediol diacrylate, tetraethylene glycol diacrylate, pentaerythritol diacrylate, pentaerythritol triacrylate, pentaerythritol tetraacrylate, dipentaerythritol diacrylate, dipentaerythritol hexaacrylate, sorbitol triacrylate, sorbitol tetraacrylate, sorbitol pentaacrylate, sorbitol hexaacrylate, tri(acryloyloxyethyl)isocyanurate, polyester acrylate oligomer, and isocyanuric acid-EO modified triacrylate.

The methacrylate esters include for example tetramethylene glycol dimethacrylate, triethylene glycol dimethacrylate, neopentyl glycol dimethacrylate, trimethylolpropane trimethacrylate, trimethylolethane trimethacrylate, ethylene glycol dimethacrylate, 1,3-butanediol dimethacrylate, hexanediol dimethacrylate, pentaerythritol dimethacrylate, pentaerythritol trimethacrylate, pentaerythritol tetramethacrylate, dipentaerythritol dimethacrylate, dipentaerythritol hexamethacrylate, sorbitol trimethacrylate, sorbitol tetramethacrylate, bis[p-(3-methacryloxy-2-hydroxypropoxy) phenyl]dimethylmethane, and bis[p-(methacryloxyethoxy) phenyl]dimethylmethane.

The itaconate esters include for example ethylene glycol diitaconate, propylene glycol diitaconate, 1,3-butanediol glycol diitaconate, 1,4-butanediol diitaconate, tetramethylene glycol diitaconate, pentaerythritol diitaconate, and sorbitol tetraitaconate. The crotonate esters include for example ethylene glycol dicrotonate, tetramethylene glycol dicrotonate, pentaerythritol dicrotonate, and sorbitol tetra(dicrotonate). The isocrotonate esters include for example ethylene glycol diisocrotonate, pentaerythritol diisocrotonate, and sorbitol tetraisocrotonate. The maleate esters include for example ethylene glycol dimaleate, triethylene glycol dimaleate, pentaerythritol dimaleate and sorbitol tetramaleate.

As the other esters, for example, there may be used aliphatic alcohol-series esters described in the individual official gazettes of JP-B-Sho 51-47334 and JP-A-Sho 57-196231; esters with aromatic backbones as described in the official gazettes of JP-A-Sho 59-5240, JP-A-Sho 59-5241 and JP-A-Hei 2-226149; and esters with amino groups as described in the official gazette of JP-A-Hei 1-165613. Furthermore, the ester monomers described above may also be used in mixture.

Specific examples of the amide monomers of aliphatic polyvalent amine compounds with unsaturated carboxylic acids include methylene bis-acrylamide, methylene bis-methacrylamide, 1,6-hexamethylene bis-acrylamide, 1,6-hexamethylene bis-methacrylamide, diethylenetriamine trisacrylamide, xylylene bisacrylamide, and xylylene bis-methacrylamide. Other preferable amide-series monomers include for example monomers with a cyclohexylene backbone as described in the official gazette of JP-B-Sho 54-21726.

Additionally, urethane-series addition-polymerizable compounds produced by using an addition reaction between isocyanate and hydroxyl group are also preferable and specifically include for example a vinylurethane compound with two or more polymerizable vinyl groups within one molecule, as produced by adding a vinyl monomer containing a hydroxyl group represented by the following general formula (A) to a polyisocyanate compound with two or more isocyanate groups within one molecule, which is described in the official gazette of JP-B-Sho 48-41708:

$$CH_2=C(R_4)COOCH_2CH(R_5)OH \qquad \text{Formula (A)}$$

wherein $R_4$ and $R_5$ represent H or $CH_3$.

Additionally, such urethane acrylates as described in the official gazettes of JP-A-Sho 51-37193, JP-B-Hei 2-32293 and JP-B-Hei 2-16765, and urethane compounds with ethylene oxide backbones as described in the official gazettes of JP-B-Sho 58-49860, JP-B-Sho 56-17654, JP-B-Sho 62-39417 and JP-B-Sho 62-39418 are also preferable. By using addition-polymerizable compounds with amino structures or sulfide structures within the molecules as described in the official gazettes of JP-A-Sho 63-277653, JP-A-Sho 63-260909 and JP-A-Hei 1-105238, a photo-polymerizable composition with a very excellent photosensitization velocity can be obtained.

Other examples include polyfunctional acrylates and methacrylates, such as polyester acrylates described in the official gazettes of JP-A-Sho 48-64183, JP-B-Sho 49-43191 and JP-B-Sho 52-30490, and epoxy acrylates from the reaction of epoxy resins with (meth)acrylic acid. Additionally, the examples include specific unsaturated compounds described in the official gazettes of JP-B-Sho 46-43946, JP-B-Hei 1-40337 and JP-B-Hei 1-40336 and vinylphosphonic acid-series compounds described in the official gazette of JP-A-Hei 2-25493.

In some case, structures with perfluoroalkyl groups as described in the official gazette of JP-A-Sho 61-22048 are preferably used. Further, those introduced as photo-setting monomers and oligomers in the Japanese Journal of Adhesion Association (Nippon Setchaku Kyokai Shi), Vol. 20, No. 7, pp. 300-308 (1984) may also be used.

The compounds with vinyl ether groups for use in accordance with the invention include compounds described in the official gazette of JP-A-2002-029162. Specific examples thereof include but are not limited to tetramethylene glycol divinyl ether, trimethylolpropane trivinyl ether, tetraethylene glycol divinyl ether, pentaerythritol divinyl ether, pentaerythritol trivinyl ether, pentaerythritol tetravinyl ether, 1,4-bis{2-(vinyloxy)ethyloxy}benzene, 1,2-bis{2-(vinyloxy)ethyloxy}benzene, 1,3-bis{2-(vinyloxy)ethyloxy}benzene, 1,3,5-tris{2-(vinyloxy)ethyloxy}benzene, 4,4'-bis{2-(vinyloxy)ethyloxy}biphenyl, 4,4'-bis{2-(vinyloxy)ethyloxy}diphenyl ether, 4,4'-bis{2-(vinyloxy)ethyloxy}diphenylmethane, 1,4-bis{2-(vinyloxy)ethyloxy}naphthalene, 2,5-bis{2-(vinyloxy)ethyloxy}furan, 2,5-bis{2-(vinyloxy)ethyloxy}thiophene, 2,5-bis{2-(vinyloxy)ethyloxy}imidazole, 2,2-bis[4-{2-(vinyloxy)ethyloxy}phenyl]propane{bis(vinyloxyethyl) ether of bisphenol A}, 2,2-bis{4-(vinyloxymethyloxy)phenyl}propane, and 2,2-bis{4-(vinyloxy)phenyl}propane.

The structures of these addition-polymerizable compounds and the details about how to use the compounds, such as single use or combined use and the amounts thereof to be added may appropriately be determined, depending on the performance and design of the final lithography printing plate precursor. For example, they are selected from the following standpoints.

In terms of sensitivity, a structure with a higher content of unsaturated groups per one molecule is preferable. In most cases, unsaturated two or more functional groups are preferable. So as to elevate the strength of the image part, namely cured film, unsaturated three or more functional groups are preferable. A method for adjusting both the sensitivity and the strength via a combined use of such compounds with different numbers of functional groups and different polymerizable groups (for example, acrylate ester, methacrylate ester, styrene-series compounds, and vinyl ether-series compounds) is effective.

In terms of the compatibility and dispersibility with other components (for example, non-water-soluble polymers, initiators, colorants, etc.) in the image recording layer, the selection of addition-polymerizable compounds and the method for using the addition-polymerizable compounds are important factors. The use of for example compounds at low purity and a combined use of two or more such compounds may sometimes improve the compatibility. Additionally, a specific structure may also be selected for the purpose of improving the adhesion of substrates or the following protective layer.

The polymerizable compounds are used within a range of preferably 5 to 80% by mass, more preferably 25 to 75% by mass of the content of all the components constituting the image recording layer. Additionally, these polymerizable compounds may be used singly or in combination of two or more thereof.

(Hydrophobic Binder Polymer)

As the hydrophobic binder polymer for use in the image recording layer, non-water-soluble polymers are preferably used. Preferably, the hydrophobic binder polymer usable in accordance with the invention substantially never contains acidic groups such as carboxyl group, sulfone group and phosphate group, while the acid value of the binder polymer (namely, the chemical equivalent number expressing the ratio of the content of acids per 1 g·polymer) is preferably 0.3 meq/g or less, more preferably 0.1 meq/g or less.

Specifically, the hydrophobic binder polymer usable in accordance with the invention is preferably insoluble in water and aqueous solutions at pH 10 or more. The solubility of the hydrophobic binder polymer in water and aqueous solutions at pH 10 or more is preferably 0.5% by mass or less, more preferably 0.1% by mass. By using such hydrophobic binder polymer, the film strength, water resistance and receptivity of the image recording layer can be improved, to improve the printing resistance.

As the hydrophobic binder polymer, conventionally known any such hydrophobic binder polymers may be used preferably within the range described above, unless the hydrophobic binder polymers deteriorate the performance of the lithography printing plate in accordance with the invention. A linear organic polymer with a film-forming property is preferable.

Examples of such hydrophobic binder polymer preferably include polymers selected from acryl resins, polyvinyl acetal resins, polyurethane resins, polyamide resins, epoxy resins, methacryl resins, styrene-series resins, and polyester resins. Among them, acryl resins are preferable and (meth)acrylate ester copolymers are preferable. More specifically, copolymers of (meth)acrylate alkyl or aralkyl ester with (meth)acrylate esters containing the unit —$CH_2CH_2O$— or the unit —$CH_2CH_2NH$— as R in the ester residue (—COOR) of (meth)acrylate ester are particularly preferable. The alkyl group in the (meth)acrylate alkyl ester is preferably an alkyl group with one to 5 carbon atoms, more preferably methyl group. Preferably, the (meth)acrylate aralkyl ester is (meth)acrylate benzyl ester.

Furthermore, the hydrophobic binder may have a crosslinking property so as to improve the film strength on the image part. So as to give the crosslinking property to the hydrophobic binder polymer, a crosslinking functional group such as ethylenic unsaturated bond may be introduced in the polymer. The crosslinking functional group may be introduced via copolymerization. Examples of the hydrophobic binder polymer with an ethylenic unsaturated bond within the molecule include polymers of the ester or amide of acrylic acid or methacrylic acid, where the residue of the ester or amide (R' in —COOR' or —CONHR') has an ethylenic unsaturated bond.

Examples of the residue with an ethylenic unsaturated bond include —$(CH_2)_n CR^1=CR^2R^3$, —$(CH_2O)_n CH_2 CR^1=CR^2R^3$, —$(CH_2CH_2O)_n CH_2 CR^1=CR^2R^3$, —$(CH_2)_n NH—CO—O—CH_2 CR^1=CR^2R^3$, —$(CH_2)_n—O—CO—CR^1=CR^2R^3$, and —$(CH_2CH_2O)_2—X$ (in the formula, $R^1$ to $R^3$ independently represent hydrogen atom, a halogen atom, or an alkyl group, aryl group, alkoxy group or aryloxy group with one to 20 carbon atoms, and $R_1$ may bind to $R^2$ or $R^3$ to form a ring; "n" represents an integer of 1 to 10; and X represents dicyclopentadienyl residue).

Specific examples of the ester residue include —$CH_2CH=CH_2$ (described in the official gazette of JP-B-Hei 7-21633), —$CH_2CH_2O—CH_2CH=CH_2$, —$CH_2C(CH_3)=CH_2$, —$CH_2CH=CH—C_6H_5$, —$CH_2CH_2OCOCH=CH—C_6H_5$, —$CH_2CH_2$—NH-COO—$CH_2CH=CH_2$, and —$CH_2CH_2O$—X (in the formula, X represents dicyclopentadienyl residue.)

Specific examples of the amide residue include —$CH_2CH=CH_2$, —$CH_2CH_2$—Y (in the formula, Y represents cyclohexene residue), and —$CH_2CH_2—OCO—CH=CH_2$.

In the hydrophobic binder polymer with a crosslinking potency, for example, a free radical (a polymerization initiator radical or a growing radical in the polymerization course of a polymerizable compound) is added to the crosslinking functional group, for addition polymerization, directly between the polymers or through a polymerized chain of a polymerizable compound, to form a crosslinking bridge between the polymer molecules for curing. Otherwise, an atom in the polymer (for example, hydrogen atom on the carbon atom adjacent to the functional crosslinking group) is drawn out with a free radical to generate a polymer radical, which is bound together to form a crosslinking bridge between the polymer molecules for curing.

The content of a crosslinking group in the hydrophobic binder polymer (the content of unsaturated double bond which can be radically polymerized, as assayed by iodine titration) is preferably 0.1 to 10.0 mmol, more preferably 1.0 to 7.0 mmol, the most preferably 2.0 to 5.5 mmol per one gram of the hydrophobic binder polymer.

From the standpoint of the improvement of the developing performance in aqueous solutions, preferably, the binder polymer is hydrophilic, while from the standpoint of the improvement of the printing resistance, importantly, the binder polymer is highly compatible with polymerizable compounds contained in the image recording layer. In other words, the binder polymer is preferably lipophilic. In such views, effectively, a hydrophilic group and a lipophilic group are copolymerized together in the hydrophobic binder polymer so as to improve the developing performance and the printing resistance in accordance with the invention. The hydrophilic group preferably includes for example hydroxyl group, carboxylate group, hydroxyethyl group, ethyleneoxy group, hydroxypropyl group, polyoxyethyl group, polyoxypropyl group, amino group, aminoethyl group, aminopropyl group, ammonium group, amide group, and carboxymethyl group. The binder polymer with the hydrophilic groups described above is preferable.

The hydrophobic binder polymer is of a weight average molecular weight of preferably 5,000 or more, more preferably 10,000 to 300,000, and of a number average molecular weight of 1,000 or more, more preferably 2,000 to 250,000. The degree of dispersion (weight average molecular weight/number average molecular weight) is preferably 1.1 to 10.

The hydrophobic binder polymer is any one of random polymers, block polymers and graft polymers and is preferably a random polymer.

The hydrophobic binder polymer may be used singly or two or more types thereof may be used in combination.

The content of the hydrophobic binder polymer is 5 to 90% by mass, preferably 10 to 70% by mass, more preferably 10 to 60% by mass of the content of all the solids in the image recording layer. Within the range, the image part can get great strength and image-forming ability.

(Infrared Absorbent)

In an image recording layer of the lithography printing plate precursor for image-like exposure, using a light source radiating infrared ray, an infrared absorbent can be used in combination with the polymerization initiator. The infrared absorbent has a function to convert the absorbed infrared ray to heat, to thermally decompose the polymerization initiator with the heat thus generated to generate radicals. The infrared absorbent to be used in accordance with the invention is a dye or a pigment with an absorption peak at a wavelength of 760 to 1200 nm.

As the dye, there can be used commercially available dyes and known dyes described in references for example "Dye Manual (Senryo Binran)", [edited by the Organic Synthetic Chemistry Association in Japan (Nippon Yuki Gosei Kyokai) and issued in 1970]. Specifically, the dye includes for example azo dyes, metal complex salt azo dyes, pyrazolone azo dyes, naphthoquinone dyes, anthraquinone dyes, phthalocyanine dyes, carbonium dyes, quinoneimine dyes, methine dyes, cyanine dyes, squarylium dyes, pyrylium salts, and metal thiolate complexes.

Preferably, the dye includes for example cyanine dyes described in for example the official gazettes of JP-A-Sho 58-125246, JP-A-Sho 59-84356, and JP-A-Sha 60-78787, methine dyes described in for example the official gazettes of JP-A-Sho 58-173696, JP-A-Sho 58-181690, and JP-A-Sho 58-194595, naphthoquinone dyes described in for example the official gazettes of JP-A-Sho 58-112793, JP-A-Sho 58-224793, JP-A-Sho 59-48187, JP-A-Sho 59-73996, JP-A-Sho 60-52940 and JP-A-Sho 60-63744, squarylium dyes described in for example the official gazette of JP-A-Sho 58-112792, and the cyanine dyes described in the specification of GBP 434,875, Additionally, the near-infrared absorption enhancers described in U.S. Pat. No. 5,156,938 are also preferably used. Additionally, there are also preferably used the substituted arylbenzo(thio)pyrylium salts described in U.S. Pat. No. 3,881,924, the trimethinethiapyrylium salts described in the official gazette of JP-A-Sho 57-142645 (the specification of U.S. Pat. No. 4,327,169), the pyrylium-series compounds described in the official gazettes of JP-A-Sho 58-181051, JP-A-Sho 58-2, JP-A-Sho 59-146063, and JP-A-Sho 59-146061, the cyanine dyes described in the official gazette of JP-A-Sho 59-216146, the pentamethinethiopyrylium salts described in the specification of U.S. Pat. No. 4,283,475 and the pyrylium compounds described in the official gazettes of JP-B-Hei 5-13514 and JP-B-Hei 5-19702. Additionally, preferable other examples of the dye include the near-infrared absorption dyes represented by the formulas (I) and (II) in the specification of U.S. Pat. No. 4,756,993.

Among these dyes, particularly preferable are cyanine dyes, squarylium dyes, pyrylium salts, nickeithiolate complexes and indolenine cyanine dyes. Furthermore, cyanine dyes and indolenine cyanine dyes are preferable. One of particularly preferable examples thereof is a cyanine dye represented by the following formula (II).

Formula (II)

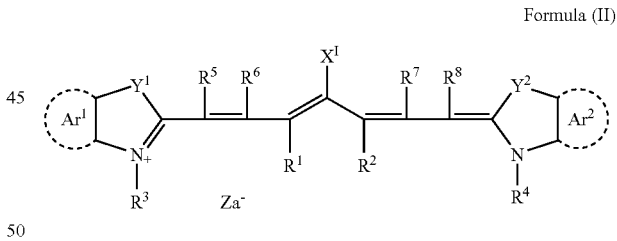

In the general formula (II), $X^1$ represents hydrogen atom, a halogen atom, —$NPh_2$, $X^2$-$L^1$ or a group shown below.

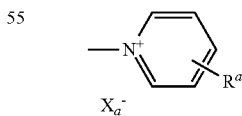

Herein, $X^2$ represents oxygen atom, nitrogen atom or sulfur atom; $L^1$ represents a hydrocarbon group with one to 12 carbon atoms, an aromatic ring with a hetero atom, and a hetero atom-containing hydrocarbon group with one to 12 carbon atoms. Herein, the term "hetero atom" means N, S, O, halogen atoms, and Se. $Xa^-$ is defined as in the same manner as for $Za^-$; $R^a$ represents hydrogen atom, or a substituent selected from the group consisting of an alkyl group, an aryl group, a substituted or unsubstituted amino group and a halogen atom.

$R^1$ and $R^2$ independently represent a hydrocarbon group with one to 12 carbon atoms. From the standpoint of the storage stability of the coating solution for the recoding layer, $R^1$ and $R^2$ are preferably a hydrocarbon group with two or more carbon atoms. Particularly preferably, further, $R^1$ and $R^2$ bind together to form a 5-membered or 6-membered ring.

$Ar^1$ and $Ar^2$ may be the same or different and independently represent an aromatic hydrocarbon group with or without substituents. Preferably, the aromatic hydrocarbon group includes benzene ring and naphthalene ring. Additionally, the substituents preferably include hydrocarbon groups with 12 or less carbon atoms, halogen atoms and alkoxy groups with 12 or less carbon atoms. $Y^1$ and $Y^2$ may be the same or different and independently represent sulfur atom, or a dialkylmethylene group with 12 or less carbon atoms. $R^3$ and $R^4$ may be the same or different and represent hydrocarbon groups with 20 or less carbon atoms and with or without substituents. Preferably, the substituents include alkoxy groups with 12 or less carbon atoms, carboxyl group and sulfo group. $R^5$, $R^6$, $R^7$ and $R^8$ may be the same or different and represent hydrogen atom or a hydrocarbon group with 12 or less carbon atoms. In view of ready availability of the raw materials, preferably, $R^5$, $R^6$, $R^7$ and $R^8$ are hydrogen atom. Additionally, $Za^-$ represents a paired anion. Provided that the cyanine dye represented by the general formula (II) has an anionic substituent within the structure and therefore never requires the neutralization of the charge, $Za^-$ is not essential. From the respect of the storage stability of the coating solution for the recording layer, preferably, $Za^-$ is a halogen ion, perchlorate ion, tetrafluoroborate ion, hexafluorophosphate ion, and sulfonate ion. Particularly preferably, $Za^-$ is perchlorate ion, hexafluorophosphate ion, and arylsulfonate ion.

Specific examples of the cyanine dye represented by the general formula (II), preferable for use in accordance with the invention, include those described in the column Nos. [0017] through [0019] in the official gazette of JP-A-2001-133969.

Additionally, particularly preferable examples thereof include the indolenine cyanine dyes specifically described in the official gazette of JP-A-2002-278057.

The pigments for use as infrared absorbents in accordance with the invention include commercially available pigments and pigments described in the Color Index (C. I.) Manual, "The Most Up-to-date Pigment Manual (Saishin Ganryo Binran)" (edited by the Japanese Pigment Technical Association (Nippon Ganryo Gijutu Kyokai) and issued in 1977), "The Most Up-to-date Pigment Application Technique (Saishin Ganyo Oyo Gijutu)" (issued by CMC Press in 1986), and "Printing Ink Technique (Insatsu Inki Gijyutu)" (issued by CMC Press in 1984).

The pigment types include black pigments, yellow pigments, orange pigments, dark brown pigments, red pigments, purple pigments, blue pigments, green pigments, fluorescent pigments, metal powder pigments, and other polymer-bound dyes. Specifically, for example, there may be used insoluble azo pigments, azo lake pigments, condensed azo pigments, chelate azo pigments, phthalocyanine-series pigments, anthraquinone-series pigments, perylene- and perinone-series pigments, thioindigo-series pigments, quinacridone-series pigments, dioxazine-series pigments, isoindolinone-series pigments, quinophthalone-series pigments, dyeing lake pigments, azine pigments, nitroso pigments, nitro pigments, naturally occurring pigments, fluorescent pigments, inorganic pigments, and carbon black. Among these pigments, carbon black is preferable.

These pigments may be used without any surface treatment or may be used after surface treatment. As the process for the surface treatment, there may be suggested a surface coating process with resins and waxes, a process with surfactant adhesion, and a process of binding reactive substances (for example, silane coupling agents, epoxy compounds, and polyisocyanate) to the surface of such pigments. The surface treatment processes are described in "Metal Soap Properties and Its Application (Kinzoku Sekken no Seishitsu to Oyo)" (Saiwai Shobo), "Print Ink Technique (Insatsu Inki Gijutu)" (issued by CMC Press in 1984), and "The Most Up-to-date Pigment Application Technique (Saishin Ganryo Oyo Gijutu)" (issued by CMC Press in 1986).

The particle size of such pigments is within a range of preferably 0.01 to 10 μm, more preferably 0.05 to 1 μm, particularly preferably 0.1 to 1 μm. Within the range, the dispersion of a pigment is at great stability in the coating solution of the image recording layer and in great homogeneity in the image recording layer.

As the process of dispersing such pigments, known dispersion techniques for use in ink production and toner production may be used. The dispersion machine includes for example ultrasonic disperser, sand mill, attritor, pearl mill, super mill, ball mill, impeller, disperser, KD mill, colloid mill, dynatron, three-roll mill, and pressure kneader. The details are described in "The Most Up-to-date Pigment Application Technique" (CMC Press, issued in 1986).

These infrared absorbents are added at the essentially minimum amount to the image recording layer, so as to suppress the adverse influence of inhibiting the polymerization reaction.

These infrared absorbents are added at a ratio of preferably 0.001 to 50% by mass, more preferably 0.005 to 30% by mass, particularly preferably 0.01 to 10% by mass of the total solids in the image recording layer. Within the range, high sensitivity can be obtained with absolutely no disadvantageous influence on the homogeneity of the image recording layer or the film strength.

(Enhancer)

In the image recording layer of a lithography printing plate precursor for image-like exposure using a light source radiating a beam at 250 to 420 nm, an enhancer may be used in combination with the polymerization initiator to enhance the efficiency of radical generation.

Specific examples of the enhancer include benzoin, benzoin methyl ether, benzoin ethyl ether, 9-fluorenone, 2-chloro-9-fluorenone, 2-methyl-9-fluorenone, 9-anthron, 2-bromo-9-anthron, 2-ethyl-9-anthron, 9,10-anthraquinone, 2-ethyl-9,10-anthraquinone, 2-t-butyl-9,10-anthraquinone, 2,6-dichloro-9,10-anthraquinone, xanthone, 2-methylxanthone, 2-methoxyxanthone, thioxanthone, benzil, dibenzalacetone, p-(dimethylamino)phenyl styryl ketone, p-(dimethylamino)phenyl p-methyl styryl ketone, benzophenone, p-(dimethylamino)benzophenone (or Michler's ketone), p-(diethylamino)benzophenone, and benzanthrone.

Further, the enhancer preferable for use in accordance with the invention includes the compound represented by the general formula (III) as described in the official gazette of JP-B-Sho 51-48516.

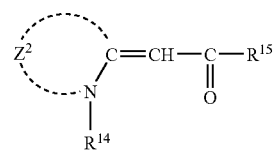

(III)

In the formula, $R^{14}$ represents an alkyl group (for example, methyl group, ethyl group, propyl group, etc.), or a substituted alkyl group (for example, 2-hydroxyethyl group, 2-methoxyethyl group, carboxymethyl group, 2-carboxyethyl group, etc.). $R^{15}$ represents an alkyl group (for example, methyl group, ethyl group, etc.), or an aryl group (for example, phenyl group, p-hydroxyphenyl group, naphthyl group, thienyl group, etc.).

$Z^2$ represents a group of non-metal atoms required for forming a heterocyclic ring nucleus containing nitrogen for general use in cyanine dyes and includes for example benzothiazoles (benzothiazole, 5-chlorobenzothiazole, 6-chlorobenzothiazole, etc.), naphthothiazoles (α-naphthothiazole, β-naphthothiazole, etc.), benzoselenazoles (benzoselenazole, 5-chlorobenzoselenazole, 6-methoxybenzoselenazole, etc.), naphthoselenazoles (α-naphthoselenazole, β-naphthoselenazole, etc.), benzoxazoles (benzoxazole, 5-methylbenzoxazole, 5-phenylbenzoxazole, etc.), and naphthoxazoles (α-naphthoxazole, β-naphthoxazole, etc.).

Specific examples of the compound represented by the general formula (III) include compounds with these $Z^2$, $R^{14}$ and $R^{15}$ in combination. A great number of such compounds exist as known substances. Thus, any one of known such compounds may be appropriately selected and used. Furthermore, preferable enhancers in accordance with the invention are the merocyanine dyes described in the official gazette of JP-B-Hei 5-47095 or ketocoumarin-series compounds represented by the following general formula (IV).

(IV)

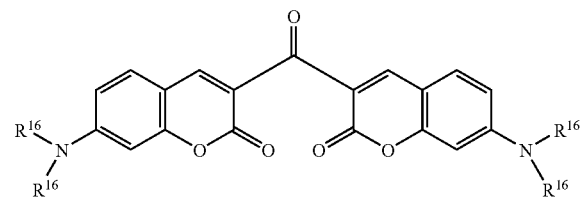

Herein, $R^{16}$ represents an alkyl group such as methyl group and ethyl group.

These enhancers are added at a ratio of preferably 0.1 to 50% by mass, more preferably 0.5 to 30% by mass and particularly preferably 0.8 to 20% by mass of the total solids constituting the image recording layer.
(Microcapsule)

In accordance with the invention, the process of allowing the constituting components of the image recording layer and the following other constituting components to be contained in the image recording layer comprises allowing a microcapsule to enclose a part of the constituting components and then adding the microcapsule to the image recording layer, as described in the official gazette of JP-A-2001-277740 and in the official gazette of JP-A-2001-277742. In that case, the individual constituting components are contained inside or outside a microcapsule at an appropriate ratio.

Any known process is applicable as the process of microencapsulating the constituting components of the image recording layer. The process of producing such microcapsule includes for example but is not limited to processes by utilizing coacervation as described in the specifications of U.S. Pat. No. 2,800,457 and U.S. Pat. No. 2,800,458, processes by interfacial polymerization as described in the specification of U.S. Pat. No. 3,287,154, and the individual official gazettes of JP-B-Sho 38-19574 and JP-B-Sho 42446, processes by polymer deposition as described in the specifications of U.S. Pat. No. 3,418,250 and U.S. Pat. No. 3,660,304, the process using an isocyanate polyol wall material as described in the specification of U.S. Pat. No. 3,796,669, processes using urea-formaldehyde-series or urea formaldehyde-resorcinol-series wall-forming materials as described in the individual specifications of U.S. Pat. No. 4,001,140, U.S. Pat. No. 4,087,376 and U.S. Pat. No. 4,089,802, the process using wall materials such as melamine-formaldehyde resin and hydroxycellulose as described in the specification of U.S. Pat. No. 4,025,446, the in situ process by monomer polymerization as described in the individual official gazettes of JP-B-Sho 36-9163 and JP-B-Sho 51-9079, the spray-drying processes as described in the specifications of GBP 930,422 and U.S. Pat. No. 3,111,407, and the electrolytic dispersion/cooling processes as described in the individual specifications of GBP 952,807 and GBP 967,074.

The microcapsule wall preferable for use in accordance with the invention has a three-dimensional crosslinking structure and has a property of swelling in solvents. From such respect, the wall material of the microcapsule is constituted of preferably polyurea, polyurethane, polyester, polycarbonate, and polyamide, and mixtures thereof, particularly preferably polyurea and polyurethane. Additionally, a compound with a crosslinking functional group such as ethylenic unsaturated bond, which can be introduced into the non-water-soluble polymer, may also be introduced onto the microcapsule wall.

The mean particle size of the microcapsule is preferably 0.01 to 3.0 μm, more preferably 0.05 to 2.0 μm and particularly preferably 0.10 to 1.0 μm. Within the range, great resolution and stability over time can be obtained.
(Other Components of Image Recording Layer)

If necessary, further, various additives can be contained in the image recording layer in accordance with the invention. These are now described below.
(Hydrophilic Polymer)

For the purpose of improving developing performance and the dispersion stability of the microcapsule, a hydrophilic polymer can be contained in the image recording layer in the lithography printing plate precursor in accordance with the invention.

The hydrophilic polymer preferably includes for example polymers with hydrophilic groups such as hydroxyl group, carboxyl group, carboxylate group, hydroxyethyl group, polyoxyethyl group, hydroxypropyl group, polyoxypropyl group, amino group, aminoethyl group, aminopropyl group, ammonium group, amide group, carboxymethyl group, sulfonate group and phosphate group.

Specific examples thereof include gum arabic, casein, gelatin, starch derivatives, carboxymethyl cellulose and the sodium salt thereof, cellulose acetate, sodium alginate, vinyl acetate-maleate copolymers, styrene-maleate copolymers, polyacrylates and salts thereof, polymethacrylates and salts thereof, homopolymers and copolymers of hydroxyethyl methacrylate, homopolymers and copolymers of hydroxyethyl acrylate, homopolymers and copolymers of hydroxypropyl methacrylate, homopolymers and copolymers of hydroxypropyl acrylate, homopolymers and copolymers of hydroxybutyl methacrylate, homopolymers and copolymers of hydroxybutyl acrylate, polyethylene glycols, hydroxypropylene polymers, polyvinyl alcohols, hydrolyzed polyvinyl acetate at a hydrolysis level of 60 mol % or more, preferably 80 mol % or more, polyvinyl formal, polyvinyl butyrate, polyvinyl pyrrolidone, homopolymers and copolymers of acrylamide, homopolymers and copolymers of methacrylamide, homopolymers and copolymers of N-methylol acrylamide, polyvinyl pyrrolidone, alcohol-soluble nylon, polyether of 2,2-bis-(4-hydroxyphenyl)-propane and epichlorohydrin, and the like.

The hydrophilic polymer is of a weight average molecular weight of preferably 5,000 or more, more preferably 10,000 to 300,000. The hydrophilic polymer is any of random polymers, block polymers, graft polymers and the like.

The content of the hydrophilic polymer in the image recording layer is preferably 20% by mass or less, more preferably 10% by mass or less of the total solids in the image recording layer.

(Surfactant)

In accordance with the invention, a surfactant is preferably used in the image recording layer so as to promote the developing performance and improve the properties of the coated face. The surfactant includes for example nonionic surfactants, anionic surfactants, cationic surfactants, amphoteric surfactants, and fluorine-series surfactants.

The surfactants may be used singly or in combination of two or more thereof.

As the nonionic surfactant for use in accordance with the invention, conventionally known nonionic surfactants may be used with no specific limitation. The nonionic surfactant includes for example polyoxyethylene alkyl ethers, polyoxyethylene alkyl phenyl ether, polyoxyethylene polystyryl phenyl ethers, polyoxyethylene polyoxypropylene alkyl ethers, glycerin fatty acid partial esters, sorbitan fatty acid partial esters, pentaerythritol fatty acid partial esters, propylene glycol monofatty acid esters, sucrose fatty acid partial esters, polyoxyethylene sorbitan fatty acid partial esters, polyoxyethylene sorbitol fatty acid partial esters, polyethylene glycol fatty acid esters, polyglycerin fatty acid partial esters, polyoxyethylene/castor oils, polyoxyethylene glycerin fatty acid partial esters, fatty acid diethanolamides, N,N-bis-2-hydroxyalkylamines, polyoxyethylene alkylamine, triethanolamine fatty acid ester, trialkylamine oxide, polyethylene glycol, and copolymers of polyethylene glycol with polypropylene glycol.

As the anionic surfactant for use in accordance with the invention, conventionally known anionic surfactants may be used with no specific limitation. The anionic surfactant includes for example fatty acid salts, abietic acid salts, hydroxyalkane sulfonate salts, alkane sulfonate salts, dialkylsulfosuccinate ester salts, linear alkylbenzene sulfonate salts, branched alkylbenzene sulfonate salts, alkylnaphthalene sulfonate salts, alkylphenoxypolyoxyethylene propylsulfonate salts, polyoxyethylene alkylsulfophenyl ether salts, N-methyl-N-oleyltaurine sodium salts, N-alkylsulfosuccinate monoamide disodium salt, petroleum sulfonate salts, sulfated beef fat, sulfate ester salts of fatty acid alkyl esters, alkylsulfate ester salts, polyoxyethylene alkyl ether sulfate ester salts, fatty acid monoglyceride sulfate ester salts, polyoxyethylene alkyl phenyl ether sulfate ester salts, polyoxyethylene styryl phenyl ether sulfate ester salts, alkylphosphate ester salts, polyoxyethylene alkyl ether phosphate ester salts, polyoxyethylene alkyl phenyl ether phosphate ester salts, partially saponified products of styrene/maleic anhydride copolymers, partially saponified products of olefin/maleic anhydride copolymers, and formalin condensates of naphthalene sulfonate salts.

As the cationic surfactant for use in accordance with the invention, any conventionally known cationic surfactants may be used with no specific limitation. The cationic surfactant includes for example alkylamine salts, quaternary ammonium salts, polyoxyethylene alkylamine salts, and polyethylene polyamine derivatives.

As the amphoteric surfactant for use in accordance with the invention, any conventionally known amphoteric surfactants may be used with no specific limitation. The amphoteric surfactant includes for example carboxybetaines, aminocarboxylic acids, sulfobetaines, aminosulfate esters, and imidazolines.

In the surfactants described above, the term "polyoxyethylene" may be understood as "polyoxyalkylene" such as polyoxymethylene, polyoxypropylene and polyoxybutylene, as well. In accordance with the invention, these surfactants may also be used.

More preferably, the surfactant includes fluorine-series surfactants with perfluoroalkyl group within the molecule. Such fluorine-series surfactants include for example anion-type fluorine-series surfactants such as perfluoroalkylcarboxylic acid salts, perfluoroalkylsulfonic acid salts, and perfluoroalkylphosphate esters; amphoteric fluorine-series surfactants such as perfluoroalkylbetaine; cation-type fluorine-series surfactants such as perfluoroalkyltrimethylammonium salts; nonionic-type fluorine-series surfactants such as perfluoroalkylamine oxide, perfluoroalkylethylene oxide adducts, oligomers with perfluoroalkyl group and a hydrophilic group, oligomers with perfluoroalkyl group and a lipophilic group, oligomers with a hydrophilic group and a lipophilic group, and urethane with perfluoroalkyl group and a lipophilic group. Additionally, the fluorine-series surfactants described in the official gazettes of JP-A-Sho 62-170950, JP-A-Sho 62-226143 and JP-A-Sho 60-168144 are preferably included therein.

The surfactants may be used singly or in combination of two or more thereof.

The content of the surfactants may be preferably 0.001 to 10% by mass, more preferably 0.01 to 7% by mass of the total solids in the image recording layer.

(Colorant)

In accordance with the invention, a dye with high absorption in the visible-ray region may be used as an image colorant. Specifically, the dye includes for example Oil Yellow #101, Oil Yellow #103, Oil Pink #312, Oil Green BG, Oil Blue BOS, Oil Blue #603, Oil Black BY, Oil Black BS, and Oil Black T-505 (all the dyes described above are manufactured by Orient Chemical Industry, Co., Ltd.); Victoria Pure Blue, crystal violet (CI42555), methyl violet (CI42535), ethyl violet, rhodamine B (CI 145170B), malachite green (CI 42000), methylene blue (CI 52015), and the dyes described in the official gazette of JP-A-Sho 62-293247. Additionally, pigments such as phthalocyanine-series dyes, azo-series dyes, carbon black and titanium oxide may also be used preferably.

These colorants may preferably be added because these colorants enable ready discrimination and identification of an image area from a non-image area. Additionally, the colorants may be added at a ratio of preferably 0.01 to 10% by mass of the total solids in the image recording materials.

(Print-Out Agent)

So as to generate a print-out image, a compound discolorable with acids or radicals may be added to the image recording layer of the invention. Such compound includes for example various dyes of diphenylmethane-series, triphenylmethane-series, thiazine-series, oxazine-series, xanthene-series, anthraquinone-series, iminoquinone-series, azo-series and azomethine-series.

Specific examples thereof include dyes such as brilliant green, ethyl violet, methyl green, crystal violet, basic fuchsin, methyl violet 2B, quinalzine red, rose Bengal, methanyl yellow, thymolsulfophthalein, xylenol blue, methyl orange, para-methyl red, congo red, benzopurpurine 4B, α-naphthyl red, Nile blue 2B, Nile blue A, methyl violet, malachite green, parafuchsin, Victoria Pure Blue BOH [manufactured by Hodogaya Chemical Co., Ltd.], Oil Blue #603 [manufactured by Orient Chemical Industry Co., Ltd.], Oil Pink #312 [manufactured by Orient Chemical Co., Ltd.], Oil Red 5B [manufactured by Orient Chemical Co., Ltd.], Oil Scarlet #308

[manufactured by Orient Chemical Co., Ltd.], Oil Red OG [manufactured by Orient Chemical Co., Ltd.], Oil Red RR [manufactured by Orient Chemical Co., Ltd.], Oil Green #502 [manufactured by Orient Chemical Co., Ltd.], Spiron Red BEH Special [manufactured by Hodogaya Chemical Co., Ltd.], m-cresol purple, cresol red, rhodamine B, rhodamine 6G, sulforhodamine B, auramine, 4-p-diethylaminophenyliminonaphthoquinone, 2-carboxyanilino-4-p-diethylaminophenyliminonaphthoquinone, 2-carboxystearylamino-4-p-diethylaminophenyliminonaphthoquinone, 1-phenyl-3-methyl-4-p-diethylaminophenylimino-5-pyrazolone, and 1-β-naphthyl-4-p-diethylaminophenylimino-5-pyrazolone; and leuco dyes such as p,p',p"-hexamethyltriaminotriphenylmethane (leucocrystal violet) and Pergascript Blue SRB [manufactured by Chiba Geigy Co., Ltd.]

Besides those described above, preference is also given to leuco dyes known as materials for thermosensitive recording paper and pressure-sensitive recording paper. Specific examples thereof include for example crystal violet lactone, malachite green lactone, benzoylleucomethylene blue, 2-(N-phenyl-N-methylamino)-6-(N-p-tolyl-N-ethyl)amino-fluorane, 2-anilino-3-methyl-6-(N-ethyl-p-toluidino)fluorane, 3,6-dimethoxyfluorane, 3-(N,N-diethylamino)-5-methyl-7-(N,N-dibenzylamino)-fluorane, 3-(N-cyclohexyl-N-methylamino)-6-methyl-7-anilinofluorane, 3-(N,N-diethylamino)-6-methyl-7-anilinofluorane, 3-(N,N-diethylamino)-6-methyl-7-xylidinofluorane, 3-(N,N-diethylamino)-6-methyl-7-chlorofluorane, 3-(N,N-diethylamino)-6-methoxy-7-aminofluorane, 3-(N,N-diethylamino)-7-(4-chloroanilino)fluorane, 3-(N,N-diethylamino)-7-chlorofluorane, 3-(N,N-diethylamino)-7-benzylaminofluorane, 3-(N,N-diethylamino)-7,8-dibenzofluorane, 3-(N,N-dibutylamino)-6-methyl-7-anilinofluorane, 3-(N,N-dibutylamino)-6-methyl-7-xylidinofluorane, 3-piperidino-6-methyl-7-anilinofluorane, 3-pyrrolidino-6-methyl-7-anilinofluorane, 3,3-bis(1-ethyl-2-methylindol-3-yl)phthalide, 3,3-bis(1-n-butyl-2-methylindol-3-yl)phthalide, 3,3-bis(p-dimethylaminophenyl)-6-dimethylaminophthalide, 3-(4-diethylamino-2-ethoxyphenyl)-3-(1-ethyl-2-methylindol-3-yl)-4-phthalide, and 3-(4-diethylaminophenyl)-3-(1-ethyl-2-methylindol-3-yl)phthalide.

The dyes discolorable with acids or radicals are added at a ratio of preferably 0.01 to 15% by mass of the total solids in the image recording layer.

(Polymerization Inhibitor)

So as to prevent unnecessary thermal polymerization of radical-polymerizable compounds during the production or storage of the image recording layer in accordance with the invention, a small amount of a thermal polymerization inhibitor is preferably added to the image recording layer.

The thermal polymerization inhibitor preferably includes for example hydroquinone, p-methoxyphenol, di-t-butyl-p-cresol, pyrogallol, t-butylcatechol, benzoquinone, 4,4'-thiobis(3-methyl-6-t-butylphenol), 2,2'-methylenebis(4-methyl-6-t-butylphenol), and N-nitroso-N-phenylhydroxylamine aluminum salt.

The thermal polymerization inhibitor is preferably added to an amount of about 0.01 to about 5% by mass of the total solids in the image recording layer.

(Higher Fatty Acid Derivatives, etc.)

So as to prevent polymerization inhibition via oxygen, for example, higher fatty acid derivatives such as behenic acid and behenamide are added to the image recording layer of the invention, where the higher fatty acid derivatives may satisfactorily be located on the surface of the image recording layer in the course of drying after coating. The higher fatty acid derivatives may preferably be added at an amount of about 0.1 to about 10% by mass of the total solids in the image recording layer.

(Plasticizer)

The image recording layer of the invention may contain a plasticizer. The plasticizer preferably includes for example phthalate esters such as dimethyl phthalate, diethyl phthalate, dibutyl phthalate, diisobutyl phthalate, dioctyl phthalate, octylcapryl phthalate, dicyclohexyl phthalate, ditridecyl phthalate, butylbenzyl phthalate, diisodecyl phthalate, and diallyl phthalate; glycol esters such as dimethylglycolphthalate, ethylphthalyl ethyl diglycolate, methylphthalyl ethyl glycolate, butylphthalyl butyl glycolate, and triethylene glycol dicaprylate ester; phosphate esters such as tricresyl phosphate and triphenyl phosphate; adibasic esters such as diisobutyl adipate, dioctyl adipate, dimethyl sebacate, dibutyl sebacate, dioctyl azelate, and dibutyl maleate; polyglycidyl methacrylate, citrate triethyl ester, glycerin triacetyl ester and butyl laurate. The plasticizer is preferably contained at a content of about 30% by mass or less of the total solids in the image recording layer.

(Inorganic Particle)

So as to improve the cured film strength on the image part in the image recording layer of the invention, inorganic particles may be contained therein. The inorganic particles preferably include for example silica, alumina, magnesium oxide, titanium oxide, magnesium carbonate, calcium alginate or mixtures thereof. These may be used in strengthening the film and the interfacial adhesion due to surface roughing even when these are not convertible in light or thermally. The organic particles are preferably of a mean particle size of 5 nm to 10 μm, more preferably 0.5 to 3 μm. Within the range, the particles can be dispersed stably in the image recording layer to sufficiently retain the film strength of the image recording layer but hardly generate staining during printing, to form a greatly hydrophilic non-image part.

The inorganic particles as described above are readily commercially available as commercial products such as colloidal silica dispersion.

The inorganic particles may be added at an amount of preferably 20% by mass or less, more preferably 10% by mass or less of the total solids in the image recording layer.

(Low-Molecular Hydrophilic Compound)

So as to improve the developing performance, the image recording layer of the invention may contain a hydrophilic, low-molecular compound. The hydrophilic, low-molecular compound includes for example water-soluble organic compounds such as glycols including ethylene glycol, diethylene glycol, triethylene glycol, propylene glycol, dipropylene glycol, and tripropylene glycol, and ether or ester derivatives thereof; polyhydroxyl compounds such as glycerin and pentaerythritol; organic amines such as triethanolamine, diethanolamine, monoethanolamine, and salts thereof; organic sulfonates such as toluenesulfonic acid and benzenesulfonic acid, and salts thereof; organic phosphonates such as phenylphosphonic acid, and salts thereof; organic carboxylic acids such as tartaric acid, oxalic acid, citric acid, malic acid, lactic acid, gluconic acid, and amino acids, and salts thereof.

(Formation of Image Recording Layer)

The image recording layer of the invention is formed by dispersing or dissolving the individual necessary components in a solvent to prepare a coating solution and then spreading the coating solution. Herein, the solvent to be used includes for example but is not limited to ethylene dichloride, cyclohexanone, methyl ethyl ketone, methanol, ethanol, propanol, ethylene glycol monomethyl ether, 1-methoxy-2-propanol, 2-methoxyethyl acetate, 1-methoxy-2-propyl acetate, dimethoxyethane, methyl lactate, ethyl lactate, N,N-dimethylacetamide, N,N-dimethylformamide, tetramethyl urea, N-methyl pyrrolidone, dimethyl sulfoxide, sulfolane, γ-butyrolactone, toluene and water. These solvents may be used singly or in combination in mixture. The concentration of solids in the coating solution is preferably 1 to 50% by mass.

The image recording layer of the invention may be formed by dispersing or dissolving the individual components in one solvent or different solvents, which components may be the same or different, to prepare plural coating solutions and then coating and drying the coating solutions plural times.

Depending on the use, the amount of the coating on the image recording layer on a support after coating and drying varies but is generally 0.3 to 3.0 g/m$^2$ preferably. Within the range, a great sensitivity and a great film profile of the image recording layer can be obtained.

Various coating methods can be used, including for example bar coater coating, rotation coating, spray coating, curtain coating, dip coating, air knife coating, blade coating and roll coating.

(Support)

With no specific limitation, any support may be used for the lithography printing plate precursor of the invention. A hydrophilic plane support dimensionally stable may be satisfactory. The support includes for example paper, paper laminated with plastics (for example, polyethylene, polypropylene, polystyrene, etc.), metal plates (for example, aluminum, zinc and copper), plastic film (for example, cellulose diacetate, cellulose triacetate, cellulose propionate, cellulose butyrate, cellulose acetate butyrate, cellulose nitrate, polyethylene terephthalate, polyethylene, polystyrene, polypropylene, polycarbonate and polyvinyl acetate), paper or plastic film laminated or disposed with the metals described above. The support is preferably polyester film or aluminum plate. Among them, an aluminum plate with good dimensional stability and at relatively low cost is preferable.

The aluminum plate is a pure aluminum plate or an aluminum alloy plate containing aluminum as the main component and a trace amount of different elements, or an aluminum- or aluminum alloy film laminated with plastics. The different elements contained in the aluminum alloy include for example silicone, iron, manganese, copper, magnesium, chromium, zinc, bismuth, nickel and titanium. The content of the different elements in the alloy is preferably 10% by mass. In accordance with the invention, a pure aluminum plate is preferable. Because it is very hard to produce completely pure aluminum from the respect of the refining technique, aluminum plates slightly containing a trace amount of different elements may be satisfactory. The composition of such aluminum plates is not specifically defined. Known aluminum plates for public use may appropriately be used.

The support is of a thickness of preferably 0.1 to 0.6 mm, more preferably 0.15 to 0.4 mm, and still more preferably 0.2 to 0.3 mm.

Prior to the use of the aluminum plate, the aluminum plate is preferably treated of the surface, by surface roughening treatment, anodic oxidation treatment and the like. Via the surface treatment, the hydrophilicity can be securely improved, while the adhesion of the image recording layer to the support can also be secured. Prior to the surface roughening treatment of the aluminum plate, degreasing processes with surfactants, organic solvents, aqueous alkaline solutions and the like are carried out, if desired, so as to remove the calender oil on the surface.

The surface roughening treatment of such aluminum plate is done by various processes, including for example mechanical roughening treatment, electro-chemical roughening treatment (electro-chemical roughening treatment for dissolving the surface), and chemical roughening treatment (roughening treatment for chemically dissolving the surface in a selective fashion).

As methods for the mechanical roughening treatment, there may be used known methods such as ball polishing method, brush polishing method, blast polishing method and buff polishing method. As methods for the electro-chemical roughening treatment, there may be used a method with alternate current or direct current in an electrolysis solution containing acids such as hydrochloric acid and nitric acid. There may additionally be used a method with a mixture acid as described in the official gazette of JP-A-Sho 54-63902.

If necessary, the aluminum plate with the surface treated for roughening is further treated by alkaline etching using aqueous solutions such as potassium hydroxide and sodium hydroxide, and is then neutralized for anodic oxidation treatment if necessary so as to enhance the abrasion resistance.

As the electrolyte for use in the anodic oxidation treatment of the aluminium plate, there may be used various electrolytes for forming porous oxidized films. Generally, sulfuric acid, hydrochloric acid, oxalic acid, and chromic acid and mixture acids thereof are used. The concentration of these electrolytes can be determined appropriately, depending on the type of the electrolytes.

The conditions for the anodic oxidation treatment cannot generally be specified because the conditions vary depending on the type of the electrolyte to be used. Generally, it is preferable that the electrolyte solution is at a concentration of 1 to 80% by mass; the liquid temperature is 5 to 70° C.; the current density is 5 to 60 A/dm$^2$; the voltage is 1 to 100 V; and the electrolysis time period is 10 seconds to 5 minutes. The amount of the anode-oxidized film formed is within a range of preferably 1.0 to 5.0 g/m$^2$, more preferably 1.5 to 4.0 g/m$^2$. Within the range, the non-image part of a lithography printing plate can get great printing resistance and good damage resistance.

The support for use in accordance with the invention may satisfactorily be the substrate with the anode-oxidized film after such surface treatment as it is. For additional improvement of the adhesion to the upper layer, the hydrophilicity, the stain resistance and the thermal insulating properties, the treatment for enlarging the micropore in the anode-oxidized film, the pore-sealing treatment of the micropore therein, and the treatment for hydrophilizing the surface comprising dipping the anode-oxidized film in an aqueous solution containing a hydrophilic compound, as described in the official gazettes of JP-A-2001-253181 and JP-A-2001-322365, may appropriately be selected and carried out, if necessary. It is needless to say that the enlargement treatment and the pore-sealing treatment are not limited to those described in these official gazettes. Any conventionally known such methods may also be carried out.

As the pore-sealing treatment, the following treatments may also be done: pore-sealing treatments with aqueous solutions containing inorganic fluorine compounds such as a single treatment with fluorozirconic acid and a treatment with sodium fluoride in addition to the vapor sealing treatment; a pore-sealing treatment with vapor with lithium chloride added thereto, and a pore-sealing treatment with hot water.

Among them, preference is given to the pore-sealing treatment with aqueous solutions containing inorganic fluorine compounds, the pore-sealing treatment with vapor and the pore-sealing treatment with hot water.

The treatment for hydrophilizing compounds includes such alkali metal silicate processes as described in the U.S. Pat. No. 2,714,033, U.S. Pat. No. 3,181,461, U.S. Pat. No. 3,280,734 and U.S. Pat. No. 3,902,734. By the processes, supports are dipped or electrolyzed in aqueous solutions of for example sodium silicate. Additionally, the treatment includes for example the treating process with potassium fluorozirconate as described in the official gazette of JP-B-Sho 36-22063, and such treating processes with polyvinyl phosphonate as described in U.S. Pat. No. 3,276,868, U.S. Pat. No. 4,153,461 and U.S. Pat. No. 4,689,272.

In case that a support with insufficient surface hydrophilicity such as polyester film is used as the support in accordance with the invention, preferably, the surface thereof is hydrophilized by coating a hydrophilic layer. The hydrophilic layer preferably includes for example a hydrophilic layer prepared by spreading a coating solution containing the colloid of an oxide or hydroxide of at least one element selected from beryllium, magnesium, aluminum, silicone, titanium, boron, germanium, tin, zirconium, iron, vanadium, antimony and transition metals, as described in the official gazette of JP-A-2001-199175; a hydrophilic layer with an organic hydrophilic matrix as prepared by the crosslinking or pseudo-crosslinking of an organic hydrophilic polymer as described in the official gazette of JPA-2002-79772; a hydrophilic layer with an inorganic hydrophilic matrix obtained via sol-gel conversion comprising the hydrolysis and condensation of polyalkoxysilane, titanate, zirconate or aluminate; or a hydrophilic layer comprising an inorganic film with the surface containing a metal oxide. Specifically, the hydrophilic layer prepared by spreading the coating solution containing the colloid of the oxide or hydroxide of silicone is preferable.

In case that a polyester film for example is used as the support of the invention, further, an antistatic layer is preferably arranged on the side of the hydrophilic layer of the support, or the opposite side thereof, or both the sides thereof. In case that the antistatic layer is arranged in between the support and the hydrophilic layer, the antistatic layer makes contributions to the improvement of the adhesion to the hydrophilic layer. As the antistatic layer, there may be used for example polymer layers with metal oxide particles or mat agents dispersed therein, as described in the official gazette of JP-A-2002-79772.

The support is preferably at the mean roughness of 0.10 to 1.2 μm along the center line. Within the range, good adhesion to the image recording layer as well as great printing resistance and high stain resistance can be obtained.

The color concentration of the support is preferably 0.15 to 0.65 in reflection concentration value. Within the range, good image formation performance due to the halation blocking during image exposure and a great print-checking profile after development can be obtained.

(Undercoating Layer)

In the lithography printing plate precursor in accordance with the invention, preferably, an undercoating layer of a compound containing polymerizable groups is arranged on the support. When such undercoating layer is used, the image recording layer is arranged on the undercoating layer. The undercoating layer enhances the adhesion between the support and the image recording layer at the exposed part, and also improves developing performance because the undercoating layer works for readily peeling off the image recording layer from the support at the non-exposed part.

Specifically, the undercoating layer preferably includes for example the silane coupling agent with a reactive group with addition-polymerizable ethylenic double bonds as described in the official gazette of JP-A-Hei 10-282679, and the phosphorus compound with a reactive group with ethylenic double bonds as described in the official gazette of JP-A-Hei 2-304441. Particularly preferable such compound includes compounds with polymerizable groups such as methacryl group and allyl groups, and support-adsorbable groups such as sulfonate group, phosphate group and phosphate ester. Compounds with hydrophilicity-providing groups such as ethylene oxide group in addition to the polymerizable group and the support-adsorbable group are also listed as the preferable compound.

The coated amount (in solids) of the undercoating layer is preferably 0.1 to 100 mg/m$^2$, more preferably 1 to 30 mg/m$^2$.

(Protective Layer)

In the lithography printing plate precursor in accordance with the invention, a water-soluble protective layer may be arranged on the image recording layer so as to prevent the occurrence of damages and the like on the image recording layer, oxygen blocking and abrasion blocking during laser exposure at high illumination.

In accordance with the invention, generally, exposure is done in atmosphere. The protective layer prevents the contamination of low-molecular compounds such as oxygen and basic substances existing in atmosphere, which inhibit exposure-generating radical polymerization in the image recording layer, to prevent the inhibition of the image formation reaction due to the exposure in atmosphere. Thus, a property required for the protective layer is low transmittance of low-molecular compounds such as oxygen. Therefore, preferably, the protective layer has great optical transmission during exposure and great adhesion to the image recording layer, and is readily removable with aqueous solutions for simple development after exposure. Various investigations have been done about protective layers with such characteristic properties. For example, the specification of U.S. Pat. No. 3,458,311 and the official gazette of JP-B-Sho 55-49729 include detailed descriptions about such protective layers.

The materials for use in the protective layer include for example water-soluble polymer compounds with relatively great crystallizability. Specifically, the materials include water-soluble polymers for example polyvinyl alcohol, polyvinyl pyrrolidone, acidic celluloses, gelatin, gum arabic, and polyacrylic acid. The use of polyvinyl alcohol (OVA) among them brings about the greatest results to the essential properties such as oxygen blocking and post-development removability. As long as the polyvinyl alcohol contains an unsubstituted vinyl alcohol unit for imparting the oxygen blocking and water-solubility required for the protective layer, the polyvinyl alcohol may partially be substituted with ester, ether or acetal and may partially contain other copolymerizable components.

Specific examples of the polyvinyl alcohol preferably include polyvinyl alcohols within a range of the polymerization degree of 300 to 2400, which are therefore hydrolyzed preliminarily at 71 to 100%. Specifically, the polyvinyl alcohol includes for example PVA-105, PVA-110, PVA-117, PVA-117H, PVA-120, PVA-124, PVA-124H, PVA-CS, PVA-CST, PVA-HC, PVA-203, PVA-204, PVA-205, PVA-210, PVA-217, PVA-220, PVA-224, PVA-217EE, PVA-217E, PVA-220E, PVA-224E, PVA-405, PVA-420, PVA-613, and L-8.

The components (such as PVA to be selected, and additives to be used) in the protective layer, and the amount thereof to be coated may appropriately be selected, taking account of for example the fogging property, the adhesion and the damage resistance other than the oxygen blocking and the post-development removability. Generally, PVA with a higher hydrolysis ratio (namely at a higher content of the unsubstituted vinyl alcohol unit in the protective layer) and a larger film thickness enhance the oxygen blocking, preferably in terms of sensitivity. So as to prevent any polymerization reaction unnecessary during the production and storage, any unnecessary fog during image exposure, and the thickening of image lines, preferably, the oxygen transmission is not too much enhanced. Thus, the oxygen transmission "A" at 25° C. and one atmospheric pressure preferably satisfies $0.2 \leq A \leq 20$ (cc/m$^2$·day).

As other components in the protective layer, for example, glycerin and dipropylene glycol may be added to an amount corresponding to several percentages by mass to the (co) polymer, to impart flexibility. Additionally, anionic surfactants such as sodium alkylsulfate, and sodium alkylsulfonate, amphoteric surfactants such as alkylaminocarboxylate salts and alkylaminodicarboxylate salts, and nonionic surfactants such as polyoxyethylene alkyl phenyl ether may be added at an amount of several percentages by mass of the water-soluble polymer compound.

The adhesion to the image part and the damage resistance are extremely important for the handling of lithography printing plate precursor. When the protective layer hydrophilized owing to the content of the water-soluble polymer compound in the protective layer is overlaid on the image recording layer which is lipophilic, the protective layer is readily peeled off due to the insufficiency of the adhesion, which may cause defects such as poor film curing due to the oxygen inhibition of the polymerization at a part with the peel-off occurrence.

So as to improve the adhesion between the image recording layer and the protective layer, various propositions have been made against the poor adhesion. For example, the official gazette of JP-A-Sho 49-70702 and the specification of GB Patent Publication No. 130,357 include descriptions such that sufficient adhesion can be obtained by mixing for example an acryl-series emulsion and a water-insoluble vinyl pyrrolidone-vinyl acetate copolymer at 20 to 60% by mass in a hydrophilic polymer mainly comprising polyvinyl alcohol and then overlaying the resulting mixture on the image recording layer. In accordance with the invention, any of these known techniques may be used.

For the purpose of improving the oxygen blocking and the surface protection of the photosensitive layer in the protective layer of the lithography printing plate precursor in accordance with the invention, further, a lamellar compound of an inorganic matter may preferably be contained therein.

Herein, the lamellar compound of an inorganic matter is in particles in thin plane forms, and includes for example a mica group such as natural mica and a synthetic mica group, as represented by the following general formula

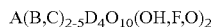

wherein, A represents any one of K, Na and Ca; B and C represent Fe(II), Fe(III), Mn, Al, Mg and V; D is Si or Al] and also includes talc, teaniolite, montmorillonite, saponite, hectorite and zirconium phosphate as represented by the formula (3).

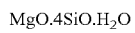    Formula (3)

In the mica group, the natural mica includes white mica, soda mica, gold mica, black mica and scaly mica. The synthetic mica includes non-swelling mica such as fluorine gold mica [$KMg_3(AlSi_3O_{10})F_2$], and potassium tetrasilicone mica [$KMg_{2.5}Si_4O_{10})F_2$], and swelling mica such as Na tetrasilicic mica [$NaMg_{2.5}(Si_4O_{10})F_2$], Na or Li teaniolite [$(Na, Li)Mg_2Li(Si_4O_{10})F_2$], and montmorillonite-series Na or Li hectorite [$(Na, Li)_{1/8}Mg_{2/5}Li_{1/8}(Si_4O_{10})F_2$]. Further, synthetic smectite is also useful.

Among the lamellar compounds of inorganic matters, in accordance with the invention, fluorine-series swelling mica as a synthetic lamellar compound of inorganic matter is particularly useful. In other words, the swelling synthetic mica and swelling clay minerals such as montmorillonite, saponite, hectorite and bentonite are in laminate structures comprising unit crystal lattice layers of a thickness of about 10 to 15 angstroms, where the substitution of metal atoms in the lattice is at a far higher level compared with other clay minerals. Consequently, the lattice layer is deficient in positive charge, so that positive ions such as $Na^+$, $Ca^{2+}$, and $Mg^{2+}$ are adsorbed in the interlayers so as to complement the deficiency. These positive ions existing in the interlayers are called exchangeable positive ions and are exchangeable with various positive ions. In case that the interlayer positive ions are $Li^+$ and $Na^+$, these have such smaller ion radius that the lamellar crystal lattice has poor binding to each other, causing significant swelling in water. When a shear force is given at that state, the lattice is readily cleaved to form a stable sol in water. The tendency is found stronger in bentonite and swelling synthetic mica, which are therefore useful in accordance with the invention Swelling synthetic mica is particularly preferably used.

From the respect of the control of dispersion, the shape of the lamellar compound of an inorganic matter for use in accordance with the invention is more preferably of a smaller thickness, while the plain size thereof is more preferably larger unless the smoothness of the coated face and the transmission of active ray can be inhibited. Therefore, the aspect ratio is 20 or more, preferably 100 or more, particularly preferably 200 or more. Herein, the aspect ratio is the ratio of the thickness to the long diameter of a particle, and can be determined on the basis of a projection view of a microscopic photograph of the particle. A larger aspect ratio can give a larger effect.

As to the particle size of the lamellar compound of an inorganic matter for use in accordance with the invention, the mean long diameter is 0.3 to 20 μm, preferably 0.5 to 10 μm, particularly preferably 1 to 5 μm. Additionally, the mean thickness of the particle is 0.1 μm or less, preferably 0.05 μm or less, particularly preferably 0.01 μm or less. For example, a swelling synthetic mica as a typical compound of the lamellar compounds of inorganic matters is of a thickness of 1-nm to 50-nm and a face size of 1-μm to 20-μm dimensionally.

When particles of such a lamellar compound of an inorganic matter and at a large aspect ratio as described above are contained in the protective layer, the coated film can get improved strength and can also effectively prevent the transmission of oxygen and water. Therefore, the particles thereof can prevent the deterioration of the protective layer through deformation, and never deteriorate the image formation performance of the lithography printing plate precursor even in a moisture change after a long-term storage under highly wet conditions. The particles thereof give great storage stability.

The content of the lamellar compound of an inorganic matter in the protective layer is preferably 5/1 to 1/100 in mass ratio of the amount of a binder used in the protective layer. Even in case of a combined use of plural types of lamellar compounds of inorganic matters, the total amount of such lamellar compounds of inorganic matters is preferably within the mass ratio described above.

A general dispersion method of the lamellar compound of an inorganic matter for use in the protective layer is now exemplified below. First, 5 to 10 parts by mass of a swelling lamellar compound listed above as a preferable lamellar compound of an inorganic matter is added to 100 parts by mass of water, for thorough mixing with water for swelling, which is then dispersed with a disperser. The disperser to be used herein includes for example various mills directly giving mechanical powers for dispersion, high-speed agitation-type dispersers with large shear force, and dispersers giving ultrasonic energy at high strength. Specifically, the disperser includes for example ball mill, sand grinder mill, visco-mill, colloid mill, homogenizer, T solver, polytron, homomixer, homoblender, Keddy mill, jet agitator, capillary type emulsification apparatus, electromagnetic type ultrasonicator, and emulsification apparatus with Paulman whistle. A dispersion of the lamellar compound of an inorganic matter at 5 to 10% by mass as dispersed by the methods described above is at a high viscosity or in gel, of which the stability under storage is very high. For preparing a coating solution of the protective layer using the dispersion, preferably, the dispersion is diluted with water and sufficiently agitated, and is then blended with a binder solution to prepare the coating solution.

To the coating solution of the protective layer may be added known additives such as surfactants to improve the coatability, and water-soluble plasticizers to improve the physicochemical properties of the film. The water-soluble plasticizers include for example propionamide, cyclohexanediol, glycerin and sorbitol. Additionally, water-soluble (meth) acryl-series polymers may also be added. Further, known additives to improve the adhesion to the photosensitive layer and the stability of the coating solution over time may be added satisfactorily.

The coating solution of the protective layer as prepared in such manner is coated on the photosensitive layer arranged on the support, and is then dried to prepare the protective layer. A coating solvent may appropriately be selected in terms of the relation with the binder. In case that a water-soluble polymer is used, distilled water and purified water may preferably be used. Any coating method of the protective layer may be applicable and includes for example but is not limited to such known methods as described in the specification of U.S. Pat. No. 3,458,311 and in the official gazette of JP-B-Sho 55-49729. Specifically, the protective layer may be coated by for example blade coating, air-knife coating, gravure coating, roll coating, spray coating, dip coating and bar coating.

The amount of the coating solution on the protective layer is preferably within a range of 0.05 to 10 g/m$^2$ on the basis of the coated amount thereof after drying. In case that the protective layer contains a lamellar compound of an inorganic matter, the coated amount is more preferably within a range of 0.1 to 0.5 g/m$^2$; and in case that the protective layer never contains a lamellar compound of an inorganic matter, the coated amount is more preferably within a range of 0.5 to 5 g/m$^2$.

(Backcoat Layer)

After the support is surface-treated or the undercoating layer is formed on the support, the back face of the support may be arranged with a backcoat, if necessary.

The backcoat preferably includes for example the organic polymer compound described in the official gazette of JP-A-Hei 5-45885 and a coating layer comprising a metal oxide prepared by the hydrolysis and condensation of the organic metal compound or inorganic metal compound described in the official gazette of JP-A-Hei 6-35174. Among them, alkoxy compounds of silicone, such as $Si(OCH_3)_4$, $Si(OC_2H_5)_4$, $Si(OC_3H_7)_4$ and $Si(OC_4H_9)_4$ are preferably used because the raw materials are readily available at low cost.

(Exposure)

By the method for producing a printing plate in accordance with the invention, the lithography printing plate precursor is exposed through a transparent original picture with a line image, a mesh image and the like or is exposed by laser scanning exposure of digital data, for image-like exposure. As the exposure source, for example, carbon arc, high-pressure mercury lamp, xenon lamp, metal halide lamp, fluorescence lamp, tungsten lamp, halogen lamp, ultraviolet laser, visible laser, and infrared laser. Particularly, the lasers are preferable and include for example a semiconductor laser radiating beams within a range of 250 to 420 nm, and a solid laser and a semiconductor laser radiating infrared ray within a range of 760 to 1200 nm. In case that such laser is used, preferably, the laser carries out scanning and exposure in an image-like manner on the basis of digital data. So as to shorten the exposure time, additionally, a multi-beam laser device is used preferably.

These lasers are arranged and used on a so-called plate setter for carrying out image-like exposure through computer control.

In accordance with the invention, development may satisfactorily be done immediately after the exposure step. However, a heating step (preheating step) may be arranged in between the exposure step and the development step. The heating treatment has an effect of improving the printing resistance and also has an effect of enhancing the uniformity of the image-curing level on the plate face. The conditions therefor may appropriately be determined within a range for exerting these effects. The heating means includes for example conventional convection oven, IR irradiation apparatus, IR laser, microwave oven, and Wisconsin oven. Specifically, the heating may be done at a temperature of the plate face within a range of 70° C. to 150° C. for one second to 5 minutes. Preferably, the heating is done within a range of preferably 80° C. to 140° C. for 5 seconds to one minute, more preferably 90° C. to 130° C. for 10 seconds to 30 seconds. Within the range, the effects are obtained highly efficiently without any adverse influence such as the deformation of the printing plate due to heat.

In that case, preferably, a heating means for use in the heating step and a developing apparatus for use in the development step are connected together, for automatic continuous treatment. Such apparatus is specifically illustrated as a production line where a plate setter and a developing apparatus are connected together via a transfer means such as conveyer. A heating means may satisfactorily be placed in between the plate setter and the developing apparatus, or a heating means and a developing apparatus may be integrated together into a single apparatus.

In case that the printing plate for use is easily exposed to optical influence in working environment, the plate-production line is preferably blocked from light with a filter or a cover. It is needless to say that without the heating treatment, the exposure means is connected directly to a developing means for continuous automatic treatment.

In accordance with the invention, further, the developing treatment may satisfactorily be done immediately after the exposure step. For the purpose of for example removing the protective layer, a rinsing step in water (pre-rinsing in water) may satisfactorily be placed in between the exposure step and the developing step.

Both of the two steps may be placed or any one of them may be introduced.

After the developing treatment is completed for forming an image as described above, an active ray such as ultraviolet ray may be used for the exposure of the whole surface, to promote the curing of the image part. The light source for the exposure of the whole surface includes for example carbon arc lamp, mercury lamp, gallium lamp, metal halide lamp, xenon lamp, tungsten lamp and various laser sources. So as to obtain satisfactory printing resistance, further, the exposure dose for the whole surface is preferably at least 10 mJ/cm$^2$ or more, more preferably 100 mJ/cm$^2$ or more.

Heating may also be done simultaneously with the exposure of the whole surface, so that the printing resistance is further improved by the heating. Such heating apparatus includes for example conventional convection oven, IR irradiation apparatus, IR laser, microwave apparatus, Wisconsin oven and the like. The temperature of the plate face then is preferably 30° C. to 150° C., more preferably 35° C. to 130° C. and still more preferably 40° C. to 120° C.

In accordance with the invention, the lithography printing plate precursor with an image formed thereon after the developing treatment and an additional treatment at the preheating step or the pre-rinsing step in water, is preferably dried so as to make the lithography printing plate precursor more easily operable. The drying method includes for example drying in natural environment by leaving materials to stand in atmosphere, drying in hot air, and methods with gum coater or a dryer equipped with an automatic developer.

EXAMPLES

The invention is now described in detail in the following Examples. However, the invention is never limited by them.

Preparation of Support

So as to remove the calender oil on the surface of an aluminium plate (material 1050) of a 0.3-mm thickness, the aluminium plate was degreased at 50° C. for 30 seconds, using an aqueous soda aluminate solution at 10% by mass (abbreviated as mass % hereinafter). Subsequently, the aluminium surface was sand-dressed with three nylon brushes planted with bundles with bristles each of a capillary diameter of 0.3 mm and an aqueous suspension of pumice of a median diameter of 25 μm (specific gravity of 1.1 g/cm³), followed by thorough rinsing in water. The plate was dipped in an aqueous 25 mass % sodium hydroxide solution at 45° C. for 9 seconds for etching, and was then rinsed in water, followed by dipping in 20 mass % nitric acid at 60° C. for 20 seconds and rinsing in water. The amount of the sand-dressed surface then etched was about 3 g/m².

Using then alternate current of 60 Hz, the surface was continuously roughened electro-chemically. The electrolyte solution then was aqueous 1 mass % nitric acid solution (containing aluminium ion at 0.5% by mass) at a liquid temperature of 50° C. The waveform of the alternate current source was a rectangular waveform in a trapezoid shape with 0.8-msec TP as the time required for the current level to reach from zero to a peak value and a duty ratio of 1:1. Using a carbon electrode as a paired pole, the electro-chemical surface roughening treatment was done. As an auxiliary anode, ferrite was used. The current density was 30 A/dm² as the peak value of the current, while 5% of the current flowing from the electric source was divided into the auxiliary anode. The quantity of electricity by the electrolysis with the nitric acid was 175 C/dm² when the aluminium plate was the anode. Subsequently, water rinsing was done by spraying.

Subsequently, an electro-chemical surface roughening treatment was done with an electrolysis solution of an aqueous 0.5 mass % hydrochloride solution (containing aluminium ion at 0.5% by mass) at a liquid temperature of 50° C. under the condition that the quantity of electricity was 50 C/dm² when the aluminium plate was the anode, by the same method as for the electrolysis with the nitric acid, followed by water rinsing by spraying. On the plate, subsequently, there was arranged a film of 2.5 g/m² prepared by anodic oxidation with direct current at a current density of 15 A/dm² using 15 mass % sulfuric acid (containing aluminium ion at 0.5% by mass) as the electrolysis solution, followed by water rinsing and drying. The mean roughness (Ra) of the plate along the center line thereof was measured, using a needle of a diameter of 2 μm. The mean roughness was 0.51 μm.

Coating the following undercoating layer (1) to a dried coat amount of 10 mg/m², a support for use in the following experiments was prepared.

Undercoating Solution (1)

| | |
|---|---|
| The following undercoating compound (1) | 0.017 g |
| Methanol | 9.00 g |
| Water | 1.00 g |

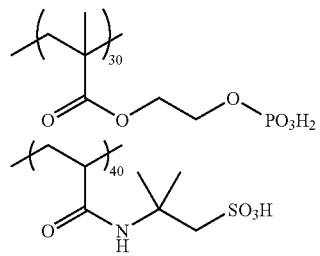

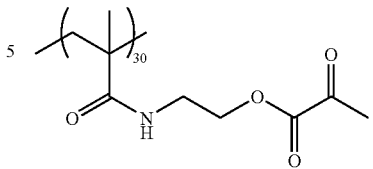

Undercoating compound (1)

Preparation of Lithography Printing Plate Precursor

The coating solution (1) for an image recording layer was coated with a bar on the support arranged with the undercoating layer, and was then dried in an oven at 100° C. for 75 seconds, to form an image recording layer at a dried coat amount of 1.0 g/m². On the image recording layer was additionally coated the coating solution (1) of the following composition for protective layer with a bar to a dried coat amount of 1.0 g/m², for drying in an oven at 100° C. for 90 seconds, to obtain a lithography printing plate precursor A.

The coating solution (1) for the image recording layer was obtained by mixing the following photosensitive solution (1) and the following microcapsule solution (1) together immediately before coating and then agitating the resulting mixture.

Photosensitive Solution (1)

| | |
|---|---|
| Binder polymer (1) | 0.162 g |
| Polymerization initiator (1) described below | 0.100 g |
| Infrared absorbent (1) described below | 0.020 g |
| A polymerizable compound Aronix M-215 (manufactured by TOAGOSEI CO., LTD.) | 0.385 g |
| Fluorine-series surfactant (1) described below | 0.044 g |
| Methyl ethyl ketone | 1.091 g |
| 1-Methoxy-2-propanol | 8.609 g |

Microcapsule Solution (1)

| | |
|---|---|
| Microcapsule (1) synthetically prepared as described below | 2.640 g |
| Water | 2.425 g |

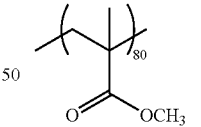

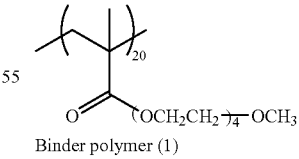

Binder polymer (1)

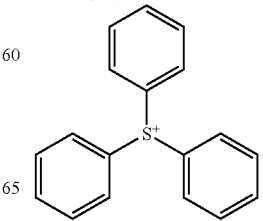

-continued

Polymerization initiator (1)

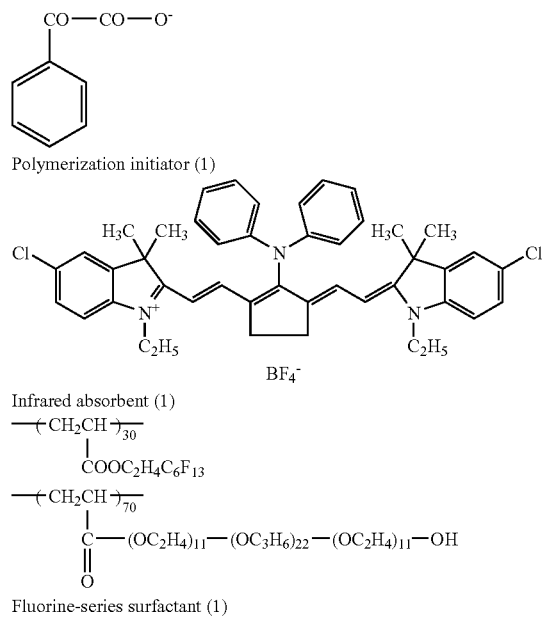

Infrared absorbent (1)

—(CH₂CH)₃₀—
           |
           COOC₂H₄C₆F₁₃

—(CH₂CH)₇₀—
           |
           C—(OC₂H₄)₁₁—(OC₃H₆)₂₂—(OC₂H₄)₁₁—OH
           ‖
           O

Fluorine-series surfactant (1)

Synthesis of Microcapsule (1)

As components for an oil phase, 10 g of an adduct of trimethylolpropane and xylene diisocyanate [manufactured by Mitsui-Takeda Chemical Co., Ltd.; Takenate D-110N in 75% ethyl acetate solution], 6.00 g of Aronix M-215 [manufactured by TOAGOSEI CO., LTD.] and 0.12 g of Pionin A-41C [manufactured by Takemoto Oil, Co., Ltd.] were dissolved in 16.67 g of ethyl acetate. As a component for an aqueous phase, an aqueous 4 mass % PVA-205 solution was prepared at 37.5 g. The components for the oil phase and the component for the aqueous phase were mixed together, for emulsification with a homogenizer at 12,000 rpm for 10 minutes. The resulting emulsion was added to 25 g of distilled water, for agitation at ambient temperature for 30 minutes and subsequent agitation at 40° C. for 2 hours. The microcapsule solution was diluted with distilled water to a solid concentration of 15% by mass. The mean particle size was 0.2 μm.

Coating Solution (1) for Protective Layer

| Water | 88 g |
| Polyvinyl alcohol PVA 105 (manufactured by Kuraray) | 10 g |
| Polyethylene glycol (molecular weight of 2,000) | 2 g |
| Surfactant described below | 1 g |

C₁₂H₂₅—O—(C₂H₄O)₈—H

Surfactant (Preparation of Lithography Printing Plate Precursor B)

After the coating solution (2) of the following composition for image recording layer was coated on the support (A) with a bar, the support was dried in an oven at 100° C. for 60 seconds, to form an image recording layer at a dried coat amount of 1.4 g/m². On the image recording layer was coated a coating solution (1) of the aforementioned composition for protective layer to a dried coat mass of 0.5 g/m², for drying at 120° C. for one minute to prepare the lithography printing plate precursor B.

Coating Solution (2) for Image Recording Layer

| Binder polymer (1) described above | 2.0 g |
| Polymerizable compound: Isocyanurate EO-modified triacrylate (Aronix M-315 manufactured by TOAGOSEI CO., LTD.) | 1.5 g |
| Compound represented below in (1) | 0.15 g |
| Compound represented below in (2) | 0.20 g |
| Compound represented below in (3) | 0.4 g |
| Ethyl violet | 0.1 g |
| Thermal polymerization inhibitor: N-Nitrosophenylhydroxylamine aluminium salt | 0.1 g |
| The water-soluble fluorine-series surfactant (1) | 0.02 g |
| Tetraethylamine hydrochloride salt | 0.06 g |
| 1-Methoxy-2-propanol | 17.5 g |
| Methyl ethyl ketone | 19.0 g |

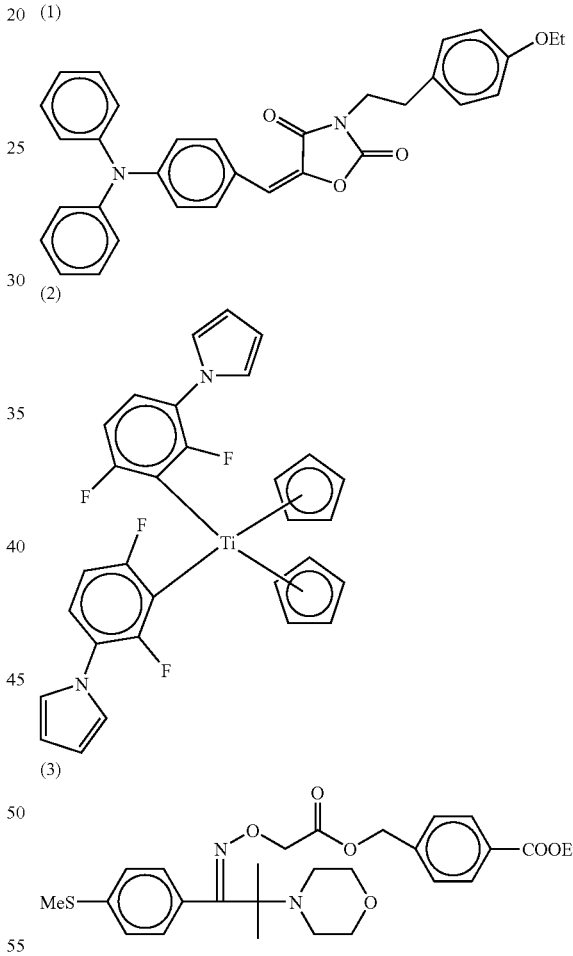

(Preparation of Lithography Printing Plate Precursor C)

After the coating solution (3) of the following composition for image recording layer was coated on the support (A) with a bar, the support was died in an oven at 70° C. for 60 seconds, to form an image recording layer at a dried coat amount of 1.1 g/m². On the image recording layer was bar-coated a coating solution (2) of the aforementioned composition for protective layer to a dried coat mass of 0.2 g/m², for drying at 125° C. for 70 seconds to prepare the lithography printing plate precursor C.

Coating Solution (3) for Image Recording Layer

| | |
|---|---|
| Binder polymer (1) of the aforementioned structure (mean molecular weight of 80,000) | 0.54 g |
| Polymerizable compound: Isocyanurate EO-modified triacrylate (Aronix M-315 manufactured by TOAGOSEI Co., LTD.) | 0.40 g |
| Polymerizable compound: Ethoxylated trimethylolpropane triacrylate (SR9035 manufactured by Nippon Kayaku Co., Ltd.; molar number of EO added is 15; molecular weight of 1,000) | 0.08 g |
| Enhancing dye (1) described below | 0.06 g |
| Polymerization initiator (2) described below | 0.18 g |
| Chain transfer agent (1) described below | 0.07 g |
| Dispersion of ε-phthalocyanine pigment (pigment; 15 parts by mass, dispersant; the binder polymer (1) of 10 parts by mass, solvent; cyclohexanone/methoxypropylacetate/1-methoxy-2-propanol = 15 parts by mass/20 parts by mass/40 parts by mass) | 0.40 g |
| Thermal polymerization inhibitor: N-Nitrosophenylhydroxylamine aluminium salt | 0.01 g |
| The water-soluble fluorine-series surfactant (1) | 0.001 g |
| Polyoxyethylene-polyoxypropylene condensate (Pluronic L44 manufactured by Asahi Denka Industry Co., Ltd.) | 0.04 g |
| Tetraethylamine hydrochloride salt | 0.01 g |
| 1-Methoxy-2-propanol | 3.5 g |
| Methyl ethyl ketone | 8.0 g |

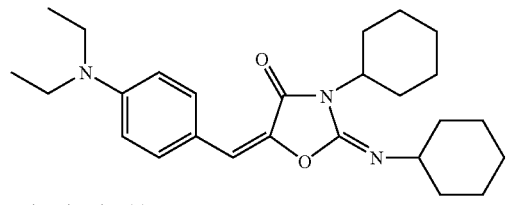

Enhancing dye (1)

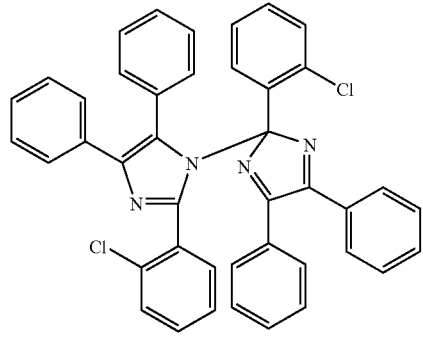

Polymerization initiator (2)

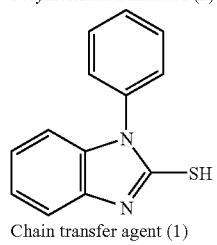

Chain transfer agent (1)

The coating solution of the following composition (2) for protective layer was coated to a dry coat amount of 0.2 g/m² with a bar, to obtain a lithography printing plate precursor C in the same manner as for the preparation of the lithography printing plate precursor A.

Coating Solution (2) for Protective Layer

| | |
|---|---|
| Mica dispersion described below (1) | 13.0 g |
| Polyvinyl alcohol (saponification degree of 98 mol %; polymerization degree of 500) | 1.3 g |
| 2-Ethylhexylsulfosuccinate soda | 0.2 g |
| Poly(vinyl pyrrolidone/vinyl acetate (1/1)) of molecular weight of 70,000 | 0.05 g |
| Surfactant (Emalex 710, manufactured by Nippon Emulsion Co., Ltd.) | 0.05 g |
| Water | 133 g |

(Preparation of Mica Dispersion (1))

32 g of the synthetic mica ["Somasif ME-100" at an aspect ratio of 1,000 or more, manufactured by Corp Chemical Corporation] was added to 368 g of water, which was then dispersed with a homogenizer (by the laser scattering method) to a mean particle size of 0.5 μm, to obtain the mica dispersion (1).

Further, the oxygen transmission ratio through the protective layer was measured under the following conditions. The oxygen transmission ratio through the protective layer was 2.0 ml/(m²·day·atom).

(Measurement of Oxygen Transmission Ratio)

An oxygen blocking layer was coated and dried on the surface of a photographic paper about 200-μm thick, of which both the surfaces were coated with polyethylene of a thickness of about 20 μm, in the same manner as for the coating on the photo-polymerizable layer, to prepare a sample for the measurement. The preliminarily measured oxygen transmission ratio of the photographic paper was about 700 ml/(m²·day·atom) under the following conditions for the measurement, which was a satisfactorily negligible value for measuring the transmission ratio through the oxygen blocking layer.

Using the sample thus obtained and also using OX-TRAN 2/20 manufactured by Mocon Corporation according to the gas transmission test method described in JIS K7126B and ASTM D3985, the oxygen transmission ratio in ml/(m²·day·atom) was measured under the conditions of 25° C. and 60% RH.

1. Preparation of Treating Solutions

The treating solutions Nos. 1 to 22 with the compositions shown below in Tables 1 and 2 were prepared. The unit in the Tables was gram [g].

TABLE 1

|  | Treating solution No. 1 | Treating solution No. 2 | Treating solution No. 3 | Treating solution No. 4 | Treating solution No. 5 | Treating solution No. 6 |
|---|---|---|---|---|---|---|
| Water | 8969.8 | 8869.8 | 8669.8 | 8469.8 | 8319.8 | 7969.8 |
| Surfactant (I-b) |  | 100 | 300 | 500 | 500 | 1000 |
| Surfactant (II-d) |  |  |  |  |  |  |
| Surfactant (II-ai) |  |  |  |  |  |  |
| Surfactant III |  |  |  |  |  |  |
| Surfactant IV |  |  |  |  |  |  |
| Benzyl alcohol |  |  |  |  | 50 |  |
| Ethylene glycol |  |  |  |  | 50 |  |
| Glycerin |  |  |  |  | 50 |  |
| Gum Arabic | 250 | 250 | 250 | 250 | 250 | 250 |
| Enzyme-modified potato starch | 700 | 700 | 700 | 700 | 700 | 700 |
| Sodium salt of dioctylsulfosuccinate ester | 50 | 50 | 50 | 50 | 50 | 50 |
| Ammonium dihydrogen phosphate | 10 | 10 | 10 | 10 | 10 | 10 |
| Citric acid | 10 | 10 | 10 | 10 | 10 | 10 |
| EDTA-4-sodium salt | 10 | 10 | 10 | 10 | 10 | 10 |
| 2-Bromo-2-nitropropane-1,3-diol | 0.1 | 0.1 | 0.1 | 0.1 | 0.1 | 0.1 |
| 2-Methyl-4-isothiazolin-3-one | 0.1 | 0.1 | 0.1 | 0.1 | 0.1 | 0.1 |
| Total | 10,000 | 10,000 | 10,000 | 10,000 | 10,000 | 10,000 |

|  | Treating solution No. 7 | Treating solution No. 8 | Treating solution No. 9 | Treating solution No. 10 | Treating solution No. 11 |
|---|---|---|---|---|---|
| Water | 8469.8 | 8469.8 | 8469.8 | 8469.8 | 8369.8 |
| Surfactant (I-b) |  |  |  |  | 300 |
| Surfactant (II-d) | 500 |  |  |  | 300 |
| Surfactant (II-ai) |  | 500 |  |  |  |
| Surfactant III |  |  | 500 |  |  |
| Surfactant IV |  |  |  | 500 |  |
| Benzyl alcohol |  |  |  |  |  |
| Ethylene glycol |  |  |  |  |  |
| Glycerin |  |  |  |  |  |
| Gum Arabic | 250 | 250 | 250 | 250 |  |
| Enzyme-modified potato starch | 700 | 700 | 700 | 700 |  |
| Sodium salt of dioctylsulfosuccinate ester | 50 | 50 | 50 | 50 |  |
| Ammonium dihydrogen phosphate | 10 | 10 | 10 | 10 |  |
| Citric acid | 10 | 10 | 10 | 10 |  |
| EDTA-4-sodium salt | 10 | 10 | 10 | 10 |  |
| 2-Bromo-2-nitropropane-1,3-diol | 0.1 | 0.1 | 0.1 | 0.1 |  |
| 2-Methyl-4-isothiazolin-3-one | 0.1 | 0.1 | 0.1 | 0.1 |  |
| Total | 10,000 | 10,000 | 10,000 | 10,000 |  |

(pH was adjusted with phosphoric acid to 4.5 to 5.5.)

TABLE 2

|  | Treating solution No.12 | Treating solution No.13 | Treating solution No.14 | Treating solution No.15 | Treating solution No.16 | Treating solution No.17 |
|---|---|---|---|---|---|---|
| Water | 9969.8 | 9869.8 | 9669.8 | 9469.8 | 9319.8 | 8969.8 |
| Surfactant (I-b) |  | 100 | 300 | 500 | 500 | 1000 |
| Surfactant (II-d) |  |  |  |  |  |  |
| Surfactant (II-ai) |  |  |  |  |  |  |
| Surfactant III |  |  |  |  |  |  |
| Surfactant IV |  |  |  |  |  |  |
| Benzyl alcohol |  |  |  |  | 50 |  |
| Ethylene glycol |  |  |  |  | 50 |  |
| Glycerin |  |  |  |  | 50 |  |
| Ammonium dihydrogen phosphate | 10 | 10 | 10 | 10 | 10 | 10 |
| Citric acid | 10 | 10 | 10 | 10 | 10 | 10 |
| EDTA-4-sodium salt | 10 | 10 | 10 | 10 | 10 | 10 |

TABLE 2-continued

| | | | | | | |
|---|---|---|---|---|---|---|
| 2-Bromo-2-nitropropane-1,3-diol | 0.1 | 0.1 | 0.1 | 0.1 | 0.1 | 0.1 |
| 2-Methyl-4-isothiazolin-3-one | 0.1 | 0.1 | 0.1 | 0.1 | 0.1 | 0.1 |
| Total | 10,000 | 10,000 | 10,000 | 10,000 | 10,000 | 10,000 |

| | Treating solution No.18 | Treating solution No.19 | Treating solution No.20 | Treating solution No.21 | Treating solution No.22 |
|---|---|---|---|---|---|
| Water | 9469.8 | 9469.8 | 9469.8 | 9469.8 | 9369 |
| Surfactant (I-b) | | | | | 300 |
| Surfactant (II-d) | 500 | | | | 300 |
| Surfactant (II-ai) | | 500 | | | |
| Surfactant III | | | 500 | | |
| Surfactant IV | | | | 500 | |
| Benzyl alcohol | | | | | |
| Ethylene glycol | | | | | |
| Glycerin | | | | | |
| Ammonium dihydrogen phosphate | 10 | 10 | 10 | 10 | |
| Citric acid | 10 | 10 | 10 | 10 | |
| EDTA-4-sodium salt | 10 | 10 | 10 | 10 | |
| 2-Bromo-2-nitropropane-1,3-diol | 0.1 | 0.1 | 0.1 | 0.1 | |
| 2-Methyl-4-isothiazolin-3-one | 0.1 | 0.1 | 0.1 | 0.1 | |
| Total | 10,000 | 10,000 | 10,000 | 10,000 | |

(pH was adjusted with phosphoricacid to 4.5 to 5.5.)

Surfactant III

Surfactant IV

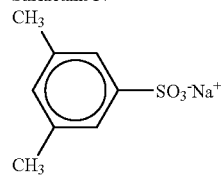

1. Evaluation of Plate Production Process (Evaluation of Developing Performance)

The resulting lithography printing plate A was exposed in an image-like manner with Trend setter 3244 VX equipped with a 40-W IR semiconductor laser of water-cooling type, as manufactured by Creo Corporation under conditions of an 9-W output, an outer drum rotation number of 210 rpm, and a resolution of 2400 dpi.

The lithography printing plate B was also exposed in an image-like manner, using a 405-nm semiconductor laser at an output of 30 mW under conditions of an energy density of 0.5 mJ/cm$^2$ and a resolution of 2400 dpi.

Then, treatment was done with a processor as shown in FIG. 1. The liquid temperature of the processing solution in the developing tank "106" was 25° C. In the FIGURE, the numerical figure "108" expresses transfer roller. The transfer time from the inlet to the outlet was preset to 15 seconds. In the FIGURE, the numerical figure "112" expresses rotation brush. The brush was rotated at a velocity of 280 mm/seconds in a forward rotation direction along the transfer direction. The lithography printing plate precursor discharged from the developing tank was spontaneously dried. The results are shown in Tables 3 and 4. Herein, the indicators of the evaluation of the developing performance are shown as follows.

E: absolutely never developed.
D: slightly developed with slightly reduced non-image concentration and highly remaining film.
C: slightly remaining thin film at a level without any disadvantages even for printing.
B: essentially no film remaining, with an extremely rare case of thin remaining film.
A: absolutely no problem without any remaining film.

3. Evaluation of Printing Performance

So as to evaluate the performance of the developing solution for allowing for no sensitization to lipid, the lithography printing plate precursor from which the photosensitive layer was preliminarily removed (at a state of uncoated plate) was arranged onto the cylinder of a printer manufactured by Heidelberg Corporation, namely Type SOR-M. Using moistening water [EU-3 (etch solution manufactured by Fuji Photo Film Co., Ltd.)/water/isopropyl alcohol=1/89/10 (in volume ratio)] and TRANS-G(N) black ink (manufactured by Dai-Nippon Ink Chemical Co., Ltd.), the printing plate precursor was used for printing on 500 sheets at a printing speed of 6,000 sheets/hour, after the moistening water and the ink were fed.

Printed matter with no stain was marked with A, while printed matter with stain was marked with B The results are shown in Tables 3, 4 and 5.

4. Evaluation of Dispersibility of Photosensitive Layer in Developing Solution

Individual concentrate solutions of the coating solution for image recording layer and the coating solution for protective layer as used in the preparation of the lithography printing plate precursor A (referred to as "concentrate solution of image recording layer" and "concentrate solution of protective layer" as well; the compositions of the individual concentrate solutions are described below) were added to individual treating solutions to 0.3:1:10 (=concentrate solution for protective layer:concentrate solution for image recording layer:treating solution). The resulting mixture solutions were agitated for 10 minutes or more and left to stand as they were for 2 weeks. The state of solid dispersion in the mixture solutions then was evaluated. The results are shown in Tables 3, 4 and 5. Herein, the indicators of the evaluation of the dispersibility of the photosensitive layer are shown below.

E: the components of the photosensitive layer were solidified, starting at the time of mixing. Absolutely never dispersible. Precipitated or adhered. Never developed.

D: turbid, and precipitation started within 2 days but the resulting precipitate was readily dispersible again.

C: turbid with almost no generation of precipitates until 1 week later.

B: turbid with almost no generation of precipitates until 2 weeks later.

A: developing solution at an approximately transparent state after mixing.

As the concentrate solution for protective layer, the amount of water in the coating solution for protective layer was adjusted to "8.8 g"; and as the concentrate solution for image recording layer, a coating solution was used, which was prepared by removing 1-methoxy-2-propanol preliminarily from the coating solution for image recording layer as described above and then adjusting the amount of methyl ethyl ketone therein to "4 g".

TABLE 3

| | Lithography printing plate | Developing solution | Development of non-exposed part | Stain of non-image part during printing | Dispersibility of photosensitive layer |
|---|---|---|---|---|---|
| Example 1 | Press plate A | Treating solution 2 | C | A | D |
| Example 2 | Press plate A | Treating solution 3 | B | A | B |
| Example 3 | Press plate A | Treating solution 4 | A | A | B |
| Example 4 | Press plate A | Treating solution 5 | A | A | A |
| Example 5 | Press plate A | Treating solution 6 | A | A | B |
| Example 6 | Press plate A | Treating solution 7 | A | A | B |
| Example 7 | Press plate A | Treating solution 8 | A | A | B |
| Example 8 | Press plate A | Treating solution 11 | A | A | B |
| Example 9 | Press plate A | Treating solution 13 | C | A | D |
| Example 10 | Press plate A | Treating solution 14 | B | A | B |
| Example 11 | Press plate A | Treating solution 15 | A | A | B |
| Example 12 | Press plate A | Treating solution 16 | A | A | A |
| Example 13 | Press plate A | Treating solution 17 | A | A | B |
| Example 14 | Press plate A | Treating solution 18 | A | A | B |
| Example 15 | Press plate A | Treating solution 19 | A | A | B |
| Example 16 | Press plate A | Treating solution 22 | A | A | B |
| Comparative Example 1 | Press plate A | Treating solution 1 | E | B | E |
| Comparative Example 2 | Press plate A | Treating solution 9 | E | B | E |
| Comparative Example 3 | Press plate A | Treating solution 10 | D | B | E |
| Comparative Example 4 | Press plate A | Treating solution 12 | E | B | E |
| Comparative Example 5 | Press plate A | Treating solution 20 | E | B | E |
| Comparative Example 6 | Press plate A | Treating solution 21 | D | B | E |

TABLE 4

| | Lithography printing plate | Treating solution | Development of non-exposed part | Stain of non-image part during printing | Dispersibility of photosensitive layer |
|---|---|---|---|---|---|
| Example 17 | Press plate B | Treating solution 2 | C | A | D |
| Example 18 | Press plate B | Treating solution 3 | B | A | B |

TABLE 4-continued

| | Lithography printing plate | Treating solution | Development of non-exposed part | Stain of non-image part during printing | Dispersibility of photosensitive layer |
|---|---|---|---|---|---|
| Example 19 | Press plate B | Treating solution 4 | A | A | B |
| Example 20 | Press plate B | Treating solution 5 | A | A | A |
| Example 21 | Press plate B | Treating solution 6 | A | A | B |
| Example 22 | Press plate B | Treating solution 7 | A | A | B |
| Example 23 | Press plate B | Treating solution 8 | A | A | B |
| Example 24 | Press plate B | Treating solution 11 | A | A | B |
| Example 25 | Press plate B | Treating solution 13 | C | A | D |
| Example 26 | Press plate B | Treating solution 14 | B | A | B |
| Example 27 | Press plate B | Treating solution 15 | A | A | B |
| Example 28 | Press plate B | Treating solution 16 | A | A | A |
| Example 29 | Press plate B | Treating solution 17 | A | A | B |
| Example 30 | Press plate B | Treating solution 18 | A | A | B |
| Example 31 | Press plate B | Treating solution 19 | A | A | B |
| Example 32 | Press plate B | Treating solution 22 | A | A | B |
| Comparative Example 7 | Press plate B | Treating solution 1 | E | B | E |
| Comparative Example 8 | Press plate B | Treating solution 9 | E | B | E |
| Comparative Example 9 | Press plate B | Treating solution 10 | D | B | E |
| Comparative Example 10 | Press plate B | Treating solution 12 | E | B | E |
| Comparative Example 11 | Press plate B | Treating solution 20 | E | B | E |
| Comparative Example 12 | Press plate B | Treating solution 21 | D | B | E |

TABLE 5

| | Lithography printing plate | Treating solution | Development of non-exposed part | Stain of non-image part during printing | Dispersibility of photosensitive layer |
|---|---|---|---|---|---|
| Example 33 | Press plate C | Treating solution 2 | C | A | D |
| Example 34 | Press plate C | Treating solution 3 | B | A | B |
| Example 35 | Press plate C | Treating solution 4 | A | A | B |
| Example 36 | Press plate C | Treating solution 5 | A | A | A |
| Example 37 | Press plate C | Treating solution 6 | A | A | B |
| Example 38 | Press plate C | Treating solution 7 | A | A | B |
| Example 39 | Press plate C | Treating solution 8 | A | A | B |
| Example 40 | Press plate C | Treating solution 11 | A | A | B |
| Example 41 | Press plate C | Treating solution 13 | C | A | D |
| Example 42 | Press plate C | Treating solution 14 | B | A | C |
| Example 43 | Press plate C | Treating solution 15 | A | A | B |
| Example 44 | Press plate C | Treating solution 16 | A | A | A |
| Example 45 | Press plate C | Treating solution 17 | A | A | B |

TABLE 5-continued

| | Lithography printing plate | Treating solution | Development of non-exposed part | Stain of non-image part during printing | Dispersibility of photosensitive layer |
|---|---|---|---|---|---|
| Example 46 | Press plate C | Treating solution 18 | A | A | B |
| Example 47 | Press plate C | Treating solution 19 | A | A | B |
| Example 48 | Press plate C | Treating solution 22 | A | A | B |
| Comparative Example 13 | Press plate C | Treating solution 1 | E | A | E |
| Comparative Example 14 | Press plate C | Treating solution 9 | E | A | E |
| Comparative Example 15 | Press plate C | Treating solution 10 | E | A | E |
| Comparative Example 16 | Press plate C | Treating solution 12 | E | A | E |
| Comparative Example 17 | Press plate C | Treating solution 20 | E | A | E |
| Comparative Example 18 | Press plate C | Treating solution 21 | D | A | E |

The results described above indicate that the developing solutions for lithography and the methods for preparing lithography in the individual Examples in accordance with the invention are apparently excellent in terms of the developing performance, the stain resistance and the dispersibility of the photosensitive layer in the developing solutions, compared with the Comparative Examples.

5. Confirmation of Plate Performance by Introduction of Preheat (Preliminary-Heating) Step Examples 49 through 57

The lithography printing plate precursors shown below in the table were placed in an oven within 30 seconds after image exposure, to which hot air was blown against the lithography printing plate precursors for heating the whole surfaces thereof. Then, the lithography printing plate precursors were retained at 110° C. for 15 seconds. The image exposure, development and printing according to the methods described above were done except for the use of the developing solutions shown below in the table within 30 seconds thereafter for development, to evaluate image reproducibility, printing performance and safelight profile. The results are shown below in the table.

Subsequently, the image reproducibility and printing performance were evaluated by the same method using the same indicators as in Examples 1 through 48 for the evaluation of development and printing performance.

The safelight profile was evaluated by the following method using the following indicators.

The lithography printing plate precursors were exposed to beams from a yellow lamp (the light from a fluorescent lamp, from which wavelengths of 500 nm or less were cut) for 30 minutes before the image exposure of the lithography printing plate precursors, followed by the image exposure described above. After development, the non-image parts of the lithography printing plates were visually examined, to evaluate the presence or absence of the occurrence of fogging (residual photosensitive layer). Herein, the indicators of the evaluation of the safelight profile of the photosensitive layer are shown below.

A: Presence or absence of the occurrence of fogging
B: Absence of the occurrence of fogging

TABLE 6

| | Lithography printing plate | Treating solution | Image reproducibility | Printing performance | Safelight profile |
|---|---|---|---|---|---|
| Example 49 | Press plate A | Treating solution 4 | A | A | A |
| Example 50 | Press plate A | Treating solution 5 | A | A | A |
| Example 51 | Press plate A | Treating solution 15 | A | A | A |
| Example 52 | Press plate B | Treating solution 5 | A | A | A |
| Example 53 | Press plate B | Treating solution 11 | A | A | A |
| Example 54 | Press plate B | Treating solution 22 | A | A | A |
| Example 55 | Press plate C | Treating solution 4 | A | A | A |
| Example 56 | Press plate C | Treating solution 15 | A | A | A |
| Example 57 | Press plate C | Treating solution 11 | A | A | A |

Via the heating treatment, the sensitivity reached 0.05 mJ/cm$^2$, while the safelight profile was excellent with no occurrence of fogging.

Examples 58 through 66

The lithography printing plate precursors shown below in the table were subjected to image exposure with a semiconductor laser plate setter Violet Vx9600 manufactured by FUJI FILM Electronic Imaging Ltd. (mounted with InGAN-series semiconductor laser emitting beams at 405 nm±10 nm/30-mW output). Using an FM screen (TAFFETA 20) at a resolution of 2438 dpi, a 35-% plain mesh was imaged at an 0.09 mJ/cm$^2$-exposure dose on the printing face. Using an automatic developer LP1250 PLX manufactured by Fuji Photo Film Co., Ltd., the lithography printing plate precursors were developed within 30 seconds after image exposure. The automatic developer was constituted in a series of a heating unit, a water-rinsing unit, a developing unit, a rinse unit and a finishing unit in this order. Heating with the heating unit was done under conditions of 100° C. and 10 seconds. In all the baths of the water-rinsing unit, the developing unit, the rinse unit and the finishing unit were charged the developing solutions shown below in the table. The temperature of the developing solutions was 28° C., while the lithography printing plates were transferred at a transfer velocity of 110 cm/min.

As in Examples 49 through 57, the image reproducibility, the printing performance and the safelight profile were evaluated. The results are shown below in the table.

After the treatment for development, the non-image parts and images on the lithography printing plates were visually examined. No residual image recording layer existed on the non-image parts, while a uniform plain mesh image without unevenness was formed. Further, the lithography printing plates were used for printing under the printing conditions described above. No stain was observed on the non-image parts, to obtain a great print of the uniform plain mesh image without unevenness.

After the treatment for development, the non-image parts and images on the lithography printing plates were visually examined. No residual image recording layer existed on the non-image parts, while a uniform plain mesh image without unevenness was formed. Further, the lithography printing plates were used for printing under the printing conditions described above. No stain was observed on the non-image parts, to obtain a great print of the uniform plain mesh image without unevenness.

The present application claims foreign priority based on Japanese Patent Application (JP 2006-024718) filed Feb. 1 of 2006, Japanese Patent Application (JP 2006-127788) filed May 1 of 2006, the contents of which is incorporated herein by reference.

What is claimed is:

1. A method for producing a lithography printing plate comprising:
   curing an image recording layer of a lithography printing plate precursor at an exposed part via image-wise exposure, the image recording layer comprising a polymerization initiator, a polymerizable compound and a hydrophobic binder and being provided on a support, said image recording layer further being provided with a protective layer thereon; and
   developing by an aqueous solution having pH 2 to 10 and containing at least one of a compound represented by formula (I) and a compound represented by formula (II) as an anionic surfactant, and a modified starch:

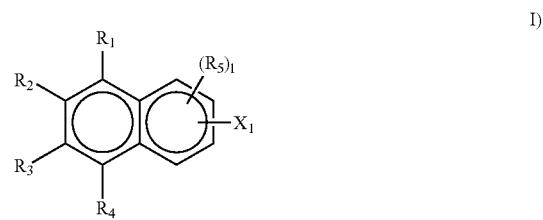

TABLE 7

| | Lithography printing plate | Treating solution | Image reproducibility | Printing performance | Safelight profile |
|---|---|---|---|---|---|
| Example 58 | Press plate A | Treating solution 4 | A | A | A |
| Example 59 | Press plate A | Treating solution 5 | A | A | A |
| Example 60 | Press plate A | Treating solution 16 | A | A | A |
| Example 61 | Press plate B | Treating solution 4 | A | A | A |
| Example 62 | Press plate B | Treating solution 15 | A | A | A |
| Example 63 | Press plate B | Treating solution 22 | A | A | A |
| Example 64 | Press plate C | Treating solution 4 | A | A | A |
| Example 65 | Press plate C | Treating solution 5 | A | A | A |
| Example 66 | Press plate C | Treating solution 15 | A | A | A |

-continued

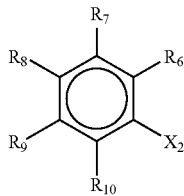

(II)

wherein, in the formulas, $R_1$ to $R_{10}$ each independently represent one of a hydrogen atom and an alkyl group; "l" represents an integer of 1 to 3; and $X_1$ and $X_2$ each independently represent one of a sulfonate salt, a sulfate monoester salt, a carboxylate salt and a phosphate salt, provided that the total sum of the carbon atoms in $R_1$ to $R_5$ and the total sum of the carbon atoms in $R_6$ to $R_{10}$, respectively is from 3 to 20 wherein the image-wise exposure is performed by using a laser irradiating a beam of 250 to 420 nm, the exposed lithography printing plate precursor is subjected to heat treatment after the image-wise exposure and prior to the development by the aqueous solution and wherein a rinsing step in water and a step for bringing the precursor into contact with an aqueous solution containing a water-soluble polymer compound are not carried out after the developing.

2. The method for producing a lithography printing plate as claimed in claim 1, wherein at least one of the polymerization initiator, polymerizable compound and hydrophobic binder are enclosed in a microcapsule.

3. The method for producing a lithography printing plate as claimed in claim 1, wherein the heat treatment is conducted at 70° C. to 150° C.

4. The method for producing a lithography printing plate as claimed in claim 1, wherein the heat treatment is conducted at 90° C. to 130° C.

5. The method for producing a lithography printing plate as claimed in claim 1, wherein $X_1$ and $X_2$ each independently represents a sulfonate salt or a carboxylate salt.

6. The method for producing a lithography printing plate as claimed in claim 1, wherein the modified starch has the following formula (III):

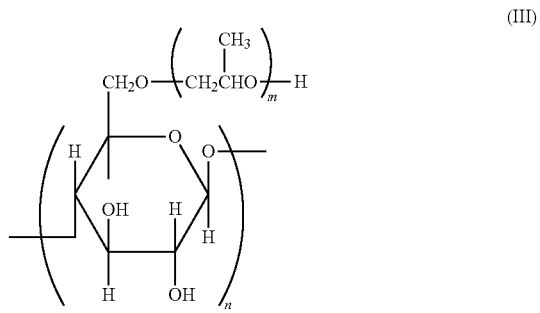

(III)

wherein the etherification level per glucose unit is within a range of 0.05 to 1.2, n represents an integer of 3 to 30 and m represents an integer of 1 to 3.

* * * * *